(12) United States Patent
Ishibashi et al.

(10) Patent No.: US 6,864,539 B2
(45) Date of Patent: Mar. 8, 2005

(54) SEMICONDUCTOR INTEGRATED CIRCUIT DEVICE HAVING BODY BIASING CIRCUIT FOR GENERATING FORWARD WELL BIAS VOLTAGE OF SUITABLE LEVEL BY USING SIMPLE CIRCUITRY

(75) Inventors: Koichiro Ishibashi, Warabi (JP); Takahiro Yamashita, Tokyo (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 0 days.

(21) Appl. No.: 10/618,710

(22) Filed: Jul. 15, 2003

(65) Prior Publication Data

US 2004/0014268 A1 Jan. 22, 2004

(30) Foreign Application Priority Data

Jul. 19, 2002 (JP) .................................... 2002-211536
Jan. 28, 2003 (JP) .................................... 2003-019271

(51) Int. Cl.[7] .............................................. H01L 23/62
(52) U.S. Cl. ........................ 257/368; 257/372; 257/901; 327/534
(58) Field of Search ................................ 257/368, 372, 257/901; 327/534

(56) References Cited

U.S. PATENT DOCUMENTS 6,469,572 B1 * 10/2002 Bruneau et al. ............ 327/537
6,515,534 B2 * 2/2003 Dabral ....................... 327/534

FOREIGN PATENT DOCUMENTS

JP    2001-345424    12/2001

OTHER PUBLICATIONS

S. Narendra et al., "1.1V 1GHz Communications Router with On–Chip Body Bias 150nm CMOS," ISSCC 2002/ Session 16/High Speed I/O 16.4, pp. 270, 271,466, Feb. 2002.

Kanda et al., "Design Impact of Positive Temperature Dependence on Drain Current in Sub–1–V CMOS VLSIs," IEEE J. Solid–State Circuits, vol. 36, No. 10, pp. 1559–1564, Oct. 2001.

* cited by examiner

Primary Examiner—David Nelms
Assistant Examiner—Tu-Tu Ho
(74) Attorney, Agent, or Firm—Staas & Halsey LLP

(57) ABSTRACT

A semiconductor integrated circuit device has a MISFET and a body biasing circuit. The MISFET has a source electrode and a drain electrode of a first conductivity type and a gate electrode, and the MISFET is formed in a well of a second conductivity type. The body biasing circuit generates a voltage in the well by passing a prescribed current in a forward direction into a diode which is formed from the well and the source electrode of the MISFET.

24 Claims, 21 Drawing Sheets

100

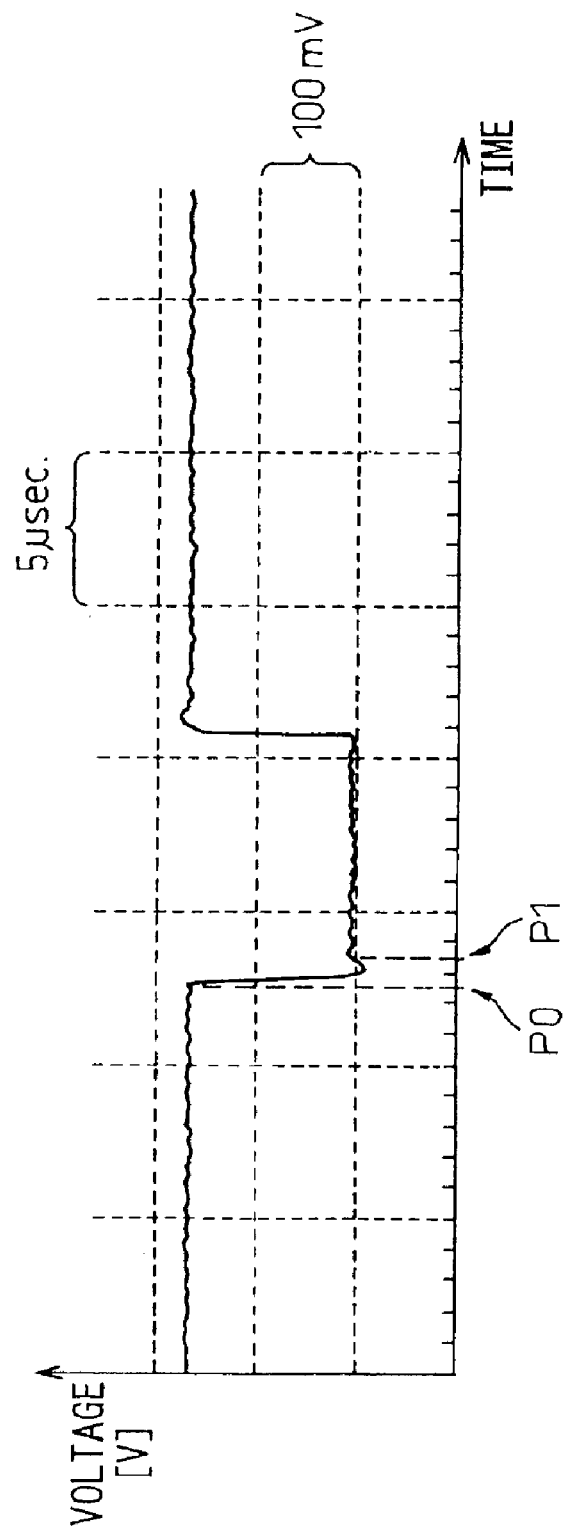

SEMICONDUCTOR INTEGRATED CIRCUIT DEVICE HAVING BODY BIASING CIRCUIT FOR GENERATING FORWARD WELL BIAS VOLTAGE OF SUITABLE LEVEL BY USING SIMPLE CIRCUITRY

CROSS REFERENCE TO RELATED APPLICATION

This application is based upon and claims the benefit of priority from the prior Japanese Patent Application Nos. 2002-211536, filed on Jul. 19, 2002 and 2003-019271, filed on Jan. 28, 2003, the entire contents of which are incorporated herein by reference.

BACKGROUND OF THE INVENTION

1. Field of the Invention

The present invention relates to a semiconductor integrated circuit device and, more particularly, to a semiconductor integrated circuit device comprising a high-speed, low-voltage operating MISFET.

2. Description of the Related Art

Recently, the widespread use and the increased functionality of portable information apparatuses such as portable telephones and portable PDAs (Personal Digital Assistants) have been driving the need to further increase the operating speed and reduce the power consumption of semiconductor integrated circuit devices constructed from MOSFETs (Metal-Oxide-Semiconductor Field Effect Transistors, or more broadly, MISFETs (Metal-Insulator-Semiconductor FETs)).

Conventionally, to reduce the power consumption of CMOS (Complementary MOS) circuits, it has been practiced to reduce the driving power supply voltage. However, as the reduced supply voltage results in a lower operating speed, if the power consumption is to be reduced without compromising the operating speed, the threshold voltage of the MOS transistors has had to be reduced. Reducing the threshold voltage of the MOS transistors leads to faster switching operation of the MOS circuit, but this in turn results in an increase in subthreshold leakage current, and hence an increase in power consumption.

In view of this, a technique that applies a forward bias voltage as a well voltage (body voltage or back-gate voltage) to a MOS transistor has been attracting attention in recent years. However, application of a forward bias voltage to the well (body) involves other problems such as an increase in chip area due to the addition of a bias voltage generating circuit. There is therefore a need to provide a semiconductor integrated circuit device having a body biasing circuit that can generate a forward body (well) bias voltage of a suitable level by using simple circuitry.

The prior art and its associated problem will be described in detail later with reference to relevant drawings.

SUMMARY OF THE INVENTION

An object of the present invention is to provide a semiconductor integrated circuit device having a body biasing circuit that can generate a forward body (well) bias voltage of a suitable level by using simple circuitry.

According to the present invention, there is provided a semiconductor integrated circuit device comprising a MISFET, having a source electrode and a drain electrode of a first conductivity type and a gate electrode, formed in a well of a second conductivity type; and a body biasing circuit that generates a voltage in the well by passing a prescribed current in a forward direction into a diode formed from the well and the source electrode of the MISFET.

The semiconductor integrated circuit device may comprise a plurality of circuit blocks; and the body biasing circuit may be provided for each of the circuit blocks. The semiconductor integrated circuit device may further comprise a power control unit which controls the body biasing circuit individually for each corresponding one of the circuit blocks.

A power control soft ware module may be carried out on a CPU, and may control the body biasing circuit individually for each corresponding one of the circuit blocks. The each circuit block may comprise a register, and each body biasing circuit may be controlled in accordance with data stored in the register. The each circuit block may be connected to a data bus, the data of the register being written through the data bus.

The semiconductor integrated circuit device may comprise a plurality of circuit blocks; and the body biasing circuit may be controlled by a control signal generated for a corresponding one of the circuit blocks. The semiconductor integrated circuit device may comprise a plurality of circuit blocks; the circuit block may include a plurality of functional blocks; and the body biasing circuit may be provided for each of the functional blocks. The semiconductor integrated circuit device may comprise a standard cell block; and the body biasing circuit may be provided for each row of the standard cell block.

The body biasing circuit may include a current source provided between a first power supply line and a contact region of the well, and may pass the prescribed current into the diode via the contact region. The current source may generate the prescribed current using the first power supply line as a power supply source. The current source may comprise a current-source first MISFET having the same polarity as the MISFET, and whose gate electrode is supplied with a control signal and whose source electrode is connected to a second power supply line; a current-source second MISFET having a different polarity from the MISFET, and whose source electrode is connected to the first power supply line and whose drain electrode and gate electrode are connected to a drain electrode of the current-source first MISFET; and a current-source third MISFET connected to the current-source second MISFET in a current-mirror configuration, and whose drain is connected to the contact region. The current source may further comprise a current-source fourth MISFET having the same polarity as the MISFET, and whose gate electrode is supplied with an inverted version of the control signal and whose source electrode is connected to the contact region and whose drain electrode is connected to the second power supply line.

The current source may comprise a current-source fifth MISFET having a different polarity from the MISFET, and whose gate electrode is supplied with a control signal and whose source electrode is connected to the first power supply line; and a current-source sixth MISFET having the same polarity as the MISFET, and whose gate electrode is supplied with the control signal and whose source electrode is connected to the contact region and whose drain electrode is connected to a second power supply line.

Further, according to the present invention, there is also provided a semiconductor integrated circuit device comprising a first MISFET of a first polarity, having a source electrode and a drain electrode of a first conductivity type and a gate electrode, formed in a first well of a second conductivity type; a second MISFET of a second polarity, having a source electrode and drain electrode of the second conductivity type and a gate electrode, formed in a second well of the first conductivity type; a first body biasing circuit that generates a voltage in the first well by passing a prescribed current in a forward direction into a diode formed from the first well and the source electrode of the first MISFET; and a second body biasing circuit that generates a voltage in the second well by passing a prescribed current in a forward direction into a diode formed from the second well and the source electrode of the second MISFET.

The semiconductor integrated circuit device may comprise a plurality of circuit blocks; and the first and second body biasing circuits may be provided for each of the circuit blocks. The semiconductor integrated circuit device may further comprise a power control unit which controls the first and second body biasing circuits individually for each corresponding one of the circuit blocks.

A power control soft ware module may be carried out on a CPU, and may control the body biasing circuit individually for each corresponding one of the circuit and each body biasing circuit may be controlled in accordance with data stored in the register. The each circuit block may be connected to a data bus, the data of the resister being written through the data bus.

The semiconductor integrated circuit device may comprise a plurality of circuit blocks; and the first and second body biasing circuits may be provided for each of the circuit blocks, and may be controlled by a control signal generated for a corresponding one of the circuit blocks. The semiconductor integrated circuit device may comprise a plurality of circuit blocks; the circuit block may include a plurality of functional blocks; and the first and second body biasing circuits may be provided for each of the functional blocks. The semiconductor integrated circuit device may comprise a standard cell block, and the first and second body biasing circuits may be provided for each row of the standard cell block.

The first body biasing circuit may include a first current source provided between a first power supply line and a contact region of the first well, and may pass the prescribed current into the first diode via the contact circuit may include a second current source provided between a second power supply line and a contact region of the second well, and may pass the prescribed current into the second diode via the contact region of the second well.

The first current source may generate the prescribed current using the first power supply line as a power supply source, and the second current source may generate the prescribed current using the second power supply line as a power supply source. The first current source may comprise a first-current-source first MISFET having the same polarity as the first MISFET, and whose gate electrode is supplied with a first control signal and whose source electrode is connected to the second power supply-line; a first-current-source second MISFET having a different polarity from the first MISFET, and whose source electrode is connected to the first power supply line and whose drain electrode and gate electrode are connected to a drain electrode of the first-current-source first MISFET; and a first-current-source third MISFET connected to the first-current-source second MISFET in a current-mirror configuration, and whose drain is connected to the contact region of the first well, and the second current source may comprise a second-current-source first MISFET having the same polarity as the second MISFET, and whose gate electrode is supplied with a second control signal and whose source electrode is connected to the first power supply line; a second-current-source second MISFET having a different polarity from the second MISFET, and whose source electrode is connected to the second power supply line and whose drain electrode and gate electrode are connected to a drain electrode of the second-current-source first MISFET; and a second-current-source second MISFET in a current-mirror configuration, and whose drain is connected to the contact region of the second well.

The first current source may further comprise a first-current-source fourth MISFET having the same polarity as the first MISFET, and whose gate electrode is supplied with an inverted version of the first control signal and whose source electrode is connected to the contact region of the first well and whose drain electrode is connected to the second power supply line; and the second current source may further comprise a second-current-source fourth MISFET having the same polarity as the second MISFET, and whose gate electrode is supplied with an inverted version of the second control signal and whose source electrode is connected to the contact region of the second well and whose drain electrode is connected to the first power supply line. The first current source may comprise a first-current-source fifth MISFET having a different polarity from the first MISFET, and whose gate electrode is supplied with a first control signal and whose source electrode is connected to the first power supply line; and a first-current-source sixth MISFET having the same polarity as the first MISFET, and whose gate electrode is supplied with the first control signal and whose source electrode is connected to the contact region of the first well and whose drain electrode is connected to the second power supply line, and the second current source may comprise a second-current-source fifth MISFET having a different polarity from the second MISFET, and whose gate electrode is supplied with a second control signal and whose source electrode is connected to the second power supply line; and a second-current-source sixth MISFET having the same polarity as the second MISFET, and whose gate electrode is supplied with the second control signal and whose source electrode is connected to the contact region of the second well and whose drain electrode is connected to the first power supply line. An operation delay may be made constant against temperature changes by operating the semiconductor integrated circuit device with a low voltage at which the semiconductor integrated circuit device exhibits the characteristic that a leakage current increases and the delay decreases with increasing temperature.

BRIEF DESCRIPTION OF THE DRAWINGS

The present invention will be more clearly understood from the description of the preferred embodiments as set forth below with reference to the accompanying drawings, wherein:

FIG. 24 is a diagram (part 4) showing measurement results for explaining the operation of the semiconductor integrated circuit device according to the present invention.

DESCRIPTION OF THE PREFERRED EMBODIMENTS

Before proceeding to the detailed description of the semiconductor integrated circuit device according to the present invention, the prior art semiconductor integrated circuit device and its associated problem will be described first, with reference to the drawings.

For high-speed and low-power operation of CMOS circuits, a technique that applies a forward bias voltage to the body (well) of a MOS transistor has been attracting attention in recent years.

Specifically, in the prior art there is proposed a semiconductor integrated circuit device (CMOS chip) that achieves both high-speed operation and low power consumption by applying a forward body bias FBB during active operation and a zero body bias ZBB in standby mode (for example, refer to S. Narendra et al., "1.1V 1 GHz Communications Router with On-Chip Body Bias 150 nm CMOS," ISSCC 2002/SESSION 16/HIGH SPEED I/O 16.4,pp. 270, 271, 466: Feb. 5, 2002).

In the prior art, there is also proposed a semiconductor integrated circuit device in which provisions are made to prevent a large current from flowing, in the event of a temperature variation by controlling the forward body bias voltages to be applied to MOS transistors, by making use of the current-voltage characteristics, with respect to temperature rises, of the PN junctions formed between differently doped diffusion regions (for example, refer to Japanese Unexamined Patent Publication No. 2001-345424).

Figure 1:
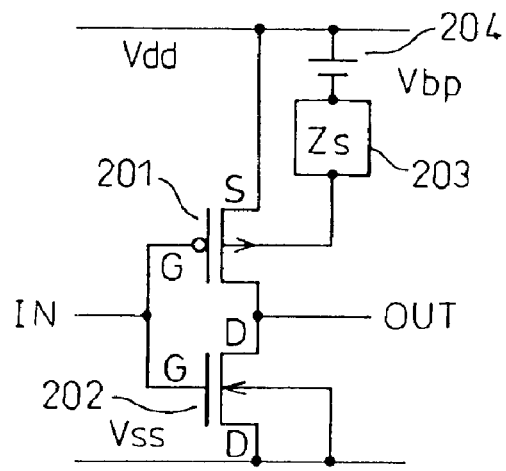
FIG. 1 is a circuit diagram showing one example of a prior art semiconductor integrated circuit device.

FIG. 1 is a circuit diagram showing one example of the prior art semiconductor integrated circuit device; the configuration of an essential portion of the former ("1.1V 1 GHz Communications Router with On-Chip Body Bias 150 nm CMOS") is shown here. In FIG. 1, reference numeral 200 is an inverter section (CMOS inverter), 201 is a p-channel MOS transistor (pMOS inverter), 202 is an n-channel MOS transistor (nMOS transistor), 203 is an impedance device, and 204 is a bias voltage generating high potential supply voltage (high potential power supply line), Vss indicates a low potential supply voltage (low potential power supply line), and Vbp denotes a pMOS transistor body bias voltage (bias voltage transistor). In each transistor, reference character G indicates the gate electrode, D the drain electrode, and S the source electrode. Further, reference character IN designates an input to the inverter, and OUT denotes an output from the inverter.

As shown in FIG. 1, in the one example of the prior art semiconductor integrated circuit device, the body bias voltage Vbp (output voltage of the bias voltage generating circuit 204) is applied to the n-well (back gate) of the pMOS transistor 201. Here, the supply voltage Vdd is, for example, 1.1 V, and the body bias voltage Vdp is Vdd-0.45V (for example, 0.55 V.)

More specifically, in the semiconductor integrated circuit device shown in FIG. 1, the forward body bias voltage Vbp of Vdd-0.45V, for example, is applied to the n-well of the pMOS transistor 201 during operation, and a zero body bias voltage is applied to it (application of the body bias voltage is stopped) in the standby mode, thereby achieving both high-speed operation, due to the reduced threshold voltage (application of the forward body bias voltage) during operation, and reduced power consumption in the standby mode. The impedance device 203 is provided to prevent an excessive current from flowing in the event of a temperature rise, etc.

Figure 2:
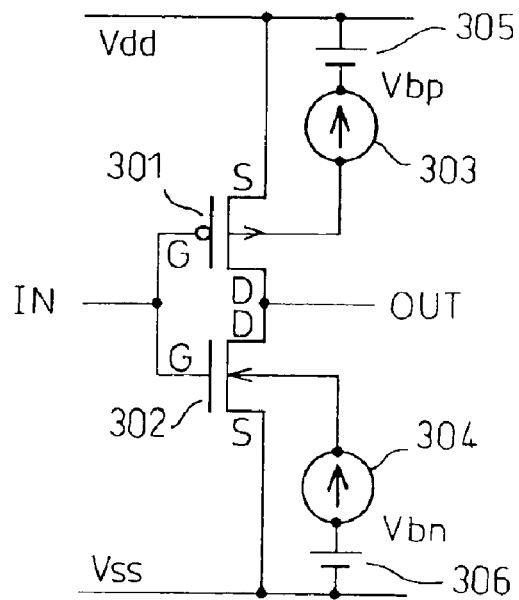
FIG. 2 is a circuit diagram showing another example of the prior art semiconductor integrated circuit device.

FIG. 2 is a circuit diagram showing another example of the prior art semiconductor integrated circuit device. In FIG.

2, reference numeral 300 is an inverter section, 301 is a pMOS transistor, 302 is an nMOS transistor, 303 and 304 are current sources, and 305 and 306 are bias voltage generating circuits. In FIG. 2, reference character Vbn designates an nMOS transistor body bias voltage (bias voltage to the p-channel body (p-channel well region) of the nMOS transistor).

As shown in FIG. 2, in the other example of the prior art semiconductor integrated circuit device, the body bias voltage Vbp (output voltage of the bias voltage generating circuit 305) is applied to the n-channel well region (n-well: back gate) of the pMOS transistor 301 via the current source 303, and the body bias voltage Vbn (output voltage of the bias voltage generating circuit 306) is applied to the p-channel well region (p-well: back gate) of the nMOS transistor 302 via the current source 304. Here, the pMOS transistor body bias voltage Vbp is a fixed voltage lower than the high potential supply voltage Vdd by a prescribed voltage, while the nMOS transistor body bias voltage Vbn is a fixed voltage higher than the low potential supply voltage Vss by a prescribed voltage.

More specifically, in the semiconductor integrated circuit device shown in FIG. 2, the forward body bias voltages to be applied to the MOS transistors, for example, are controlled by making use of the current-voltage characteristics, with respect to temperature rises, of the PN junctions one between the p⁻ diffusion region and the n-well (between the p-well and the n⁺ diffusion region) and the other between the p⁺ diffusion region and the n-well (between the p-well and the n⁻ diffusion region), thereby eliminating the possibility of latchup and thus preventing a large leakage current from flowing in the event of a temperature variation.

As described above, the prior art proposes the configuration in which the semiconductor integrated circuit device constructed from a CMOS circuit is driven at high speed and with low power consumption by applying a body bias voltage to the body (well) of the MOS transistor(s).

However, the semiconductor integrated circuit device shown in FIG. 1 or 2 has the problem that the chip area is increased, because a body voltage generating circuit requiring a certain amount of circuitry has to be provided to generate the forward body bias voltage (for example, about 0.4 to 0.5 V). Furthermore, as the forward body bias voltage must be set with a certain degree of margin, the body bias voltage is kept to a small value, and this makes it difficult to achieve high-speed operation by reducing the transistor threshold voltage as far as possible.

Next, the basic functional configuration of the semiconductor integrated circuit device according to the present invention will be described.

Figure 3:
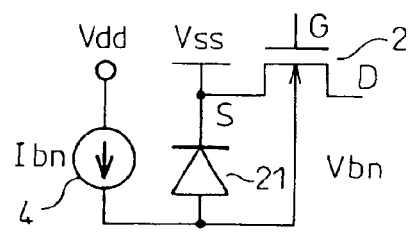
FIG. 3 is a circuit diagram showing the basic functional configuration of a semiconductor integrated circuit device according to the present invention.
Figure 4:
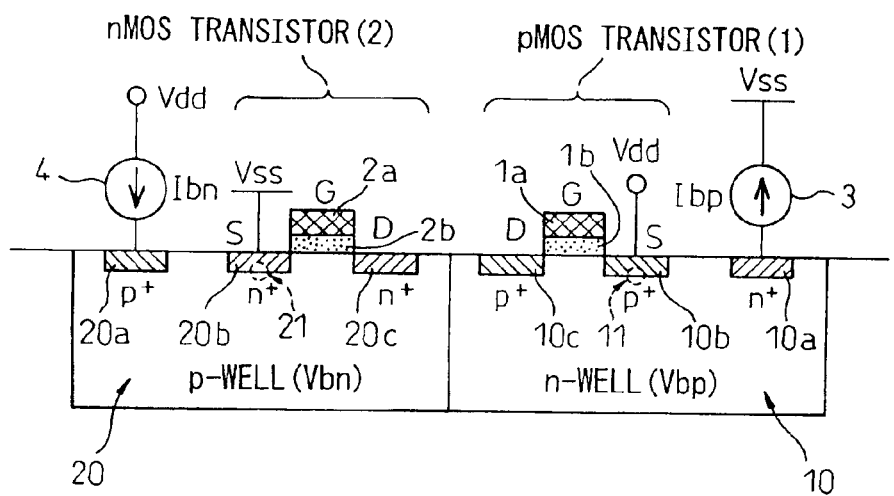
FIG. 4 is a cross-sectional view for explaining the basic functional configuration of the semiconductor integrated circuit device according to the present invention.

FIG. 3 is a circuit diagram showing the basic functional configuration of the semiconductor integrated circuit device according to the present invention, and FIG. 4 is a cross-sectional view for explaining the basic functional configuration of the semiconductor integrated circuit device according to the present invention. The circuit shown in FIG. 3 corresponds to the part of the nMOS transistor (2) shown in FIG. 4. The inverter (CMOS inverter) constructed with the pMOS transistor 1 and nMOS transistor 2 will be described in detail later in conjunction with FIG. 4.

In FIGS. 3 and 4, reference numeral 2 is the nMOS transistor, 4 is a current source, and 21 is a diode (parasitic diode). In FIG. 4, reference numeral 2a is a conducting electrode, 2b is an insulating film, 20 is a p-channel semiconductor substrate (p-channel well), 20a is a p⁺ diffusion region, and 20b and 20c are n⁺ diffusion regions.

As shown in FIGS. 3 and 4, the nMOS transistor 2 is formed in the p-channel well (p-well) 20, and comprises the n⁺ diffusion region (source electrode S) 20b, the n⁺ diffusion region (drain electrode D) 20c, and the conducting electrode (gate electrode G) 2a separated by the insulating film 2b. In a conventional pMOS transistor (reverse body biased transistor), a low potential supply voltage Vss would be applied to the p-well 20 (the back gate of the nMOS transistor 2) via the p⁺ diffusion region (contact region) 20a, but in the present invention, a high potential supply voltage Vdd is applied to the contact region (p⁺ diffusion region) 20a via the current source 4. The diode 21 shown in FIG. 3 is formed between the p-well 20 and the source electrode (S) 20b.

According to the present invention, the body bias voltage Vbn is generated with the output current (constant current) Ibn of the current source 4 flowing in a forward direction into the diode 21 formed from the p-well 20 and the source electrode S (n⁺ diffusion region 20b). Here, the current Ibn is set to a negligibly small value compared with the current, including the switching current, that flows through the entire circuit (for example, to a value equal to or smaller than one tenth of the current flowing through the entire circuit).

Figure 5:
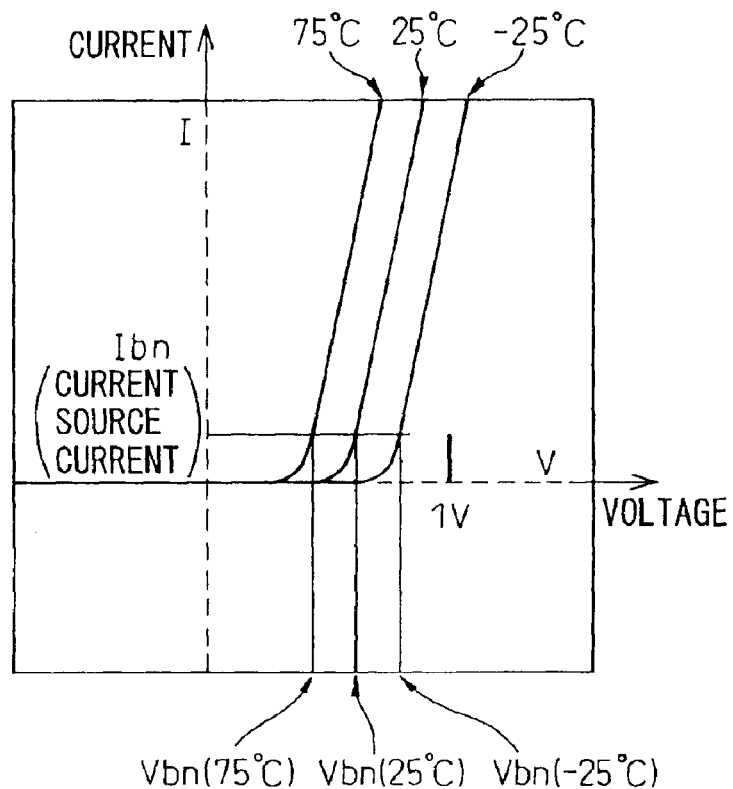
FIG. 5 is a diagram showing diode characteristics for explaining the principle of the semiconductor integrated circuit device according to the present invention.

FIG. 5 is a diagram showing diode characteristics for explaining the principle of the semiconductor integrated circuit device according to the present invention.

As shown in FIG. 5, the diode (21) exhibits different current-voltage characteristics at different temperatures (for example, at 75° C., 25° C., and −25° C.). In the present invention, as the constant output current Ibn of the current source 4 flows into the diode 21, the largest possible body bias voltage at each temperature can be applied to the p-well 20.

That is, in the prior art, in the case of the forward body bias voltage Vbn applied to the p-well 20, as the setting is made by considering, for example, the upper limit temperature defined in the specification of the semiconductor integrated circuit device (for example, 75° C. by allowing a certain margin), it has not been possible to reduce the threshold voltage of the transistor (pMOS transistor 2) as much as possible by increasing the forward body bias voltage (Vbn), and as a result, it has been difficult to maximize the operating speed of the circuit.

On the other hand, according to the semiconductor integrated circuit device of the present invention, the operating speed of the circuit can be maximized according to the operating temperature. Furthermore, according to the semiconductor integrated circuit device of the present invention, as the output of the current source is applied to the well (body) by using the contact region directly, and the body bias voltage is generated by using the diode formed from the well and the source electrode (diffusion region), the circuit configuration is simple and the chip area can be reduced. Moreover, according to the semiconductor integrated circuit device of the present invention, as the current for generating the forward body bias voltage is regulated by the current source, the power consumption (the current flowing through the circuit) can be controlled independently of temperature changes, etc.

Embodiments of the semiconductor integrated circuit device according to the present invention will be described in detail below with reference to the accompanying drawings.

Figure 6:
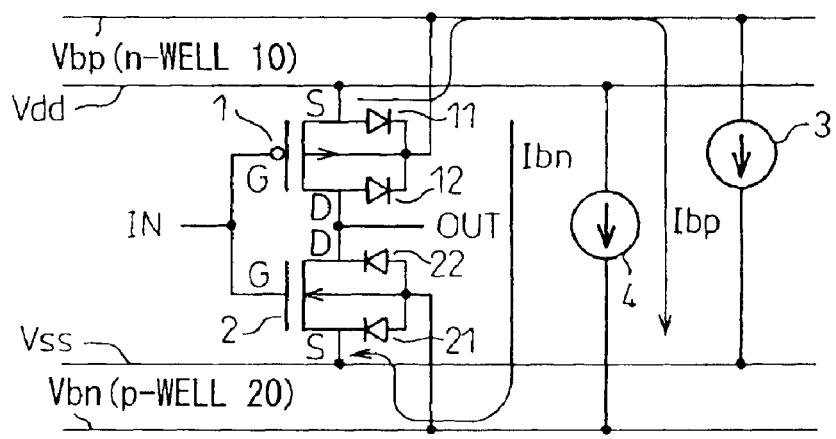
FIG. 6 is a circuit diagram conceptually showing one embodiment of the semiconductor integrated circuit device according to the present invention.

FIG. 6 is a circuit diagram conceptually showing one embodiment of the semiconductor integrated circuit device according to the present invention; a CMOS inverter section is shown here. In FIG. 6, reference numeral 1 is a pMOS transistor, 2 is an nMOS transistor, 11, 12, 21, and 22 are diodes (parasitic diodes), and 3 and 4 are current sources.

As shown in FIG. 6 and also in FIG. 4 previously given, the nMOS transistor 2 is formed in the p-well 20, and comprises the source electrode S ($n^+$ diffusion region 20b), the drain electrode D ($n^+$ diffusion region 20c), and the gate electrode G (conducting electrode 2a) separated by the insulating film 2b. Likewise, the PMOS transistor 2 is formed in the n-channel well (n-well) 10, and comprises the source electrode S ($p^+$ diffusion region) 10b, the drain electrode D ($p^+$ diffusion region) 10c, and the gate electrode G (conducting electrode) 1a separated by the insulating film 1b.

In the nMOS transistor 2, the current source 4 coupled to the high potential supply voltage Vdd is connected to the contact region ($p^+$ diffusion region) 20a, and flows the forward current Ibn into the diode 21 formed from the p-well 20 and the source electrode S ($n^+$ diffusion region 20b). With the current Ibn flowing through the diode 21, a prescribed forward body bias voltage Vbn is generated in the p-well 20. Here, as earlier described with reference to FIG. 5, the body bias voltage Vbn changes to an optimum level according to the operating temperature; that is, when the operating temperature is high (for example, 75° C.), the body bias voltage Vbn decreases and the transistor threshold voltage is set higher, while when the operating temperature is low (for example, −25° C.), the body bias voltage Vbn increases and the transistor threshold voltage is set lower, thus fully achieving high-speed circuit operation with the low-threshold voltage transistor.

Likewise, in the pMOS transistor 1, the current source 3 coupled to the low potential supply voltage Vss is connected to the contact region ($n^+$ diffusion region) 10a, and passes the forward current Ibp into the diode 11 formed from the n-well 10 and the source electrode S ($p^+$ diffusion region 10b). With the current Ibp flowing through the diode 11, a prescribed forward body bias voltage Vbp is generated in the n-well 10. Here, the body bias voltage Vbp in the pMOS transistor 1, just as the body bias voltage Vbn in the nMOS transistor 2 described above, changes to an optimum level according to the operating temperature; that is, when the operating temperature is high, the body bias voltage Vbp increases and the transistor threshold voltage is set higher, while when the operating temperature is low (for example, −25° C.), the body bias voltage Vbp decreases and the transistor threshold voltage is set lower, thus fully achieving high-speed circuit operation with the low-threshold voltage transistor.

Figure 7:
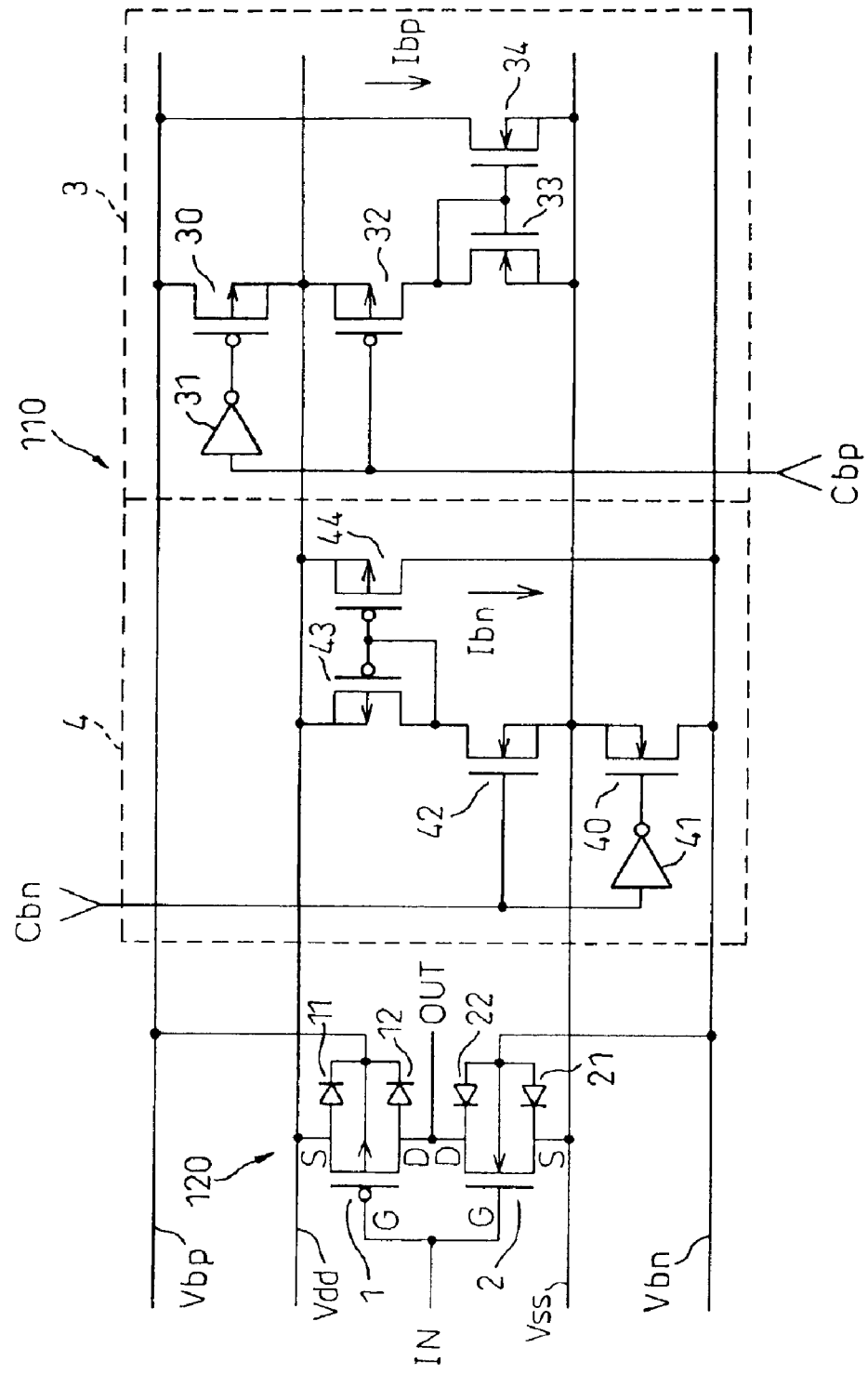
FIG. 7 is a circuit diagram showing one configuration example of the semiconductor integrated circuit device shown in FIG. 6.

FIG. 7 is a circuit diagram showing one configuration example of the semiconductor integrated circuit device shown in FIG. 6; one example of the body biasing circuit 110 (current sources 3 and 4) is shown here.

As shown in FIG. 7, the current source 4 comprises an inverter 41, nMOS transistors 40 and 42, and pMOS transistors 43 and 44. When a control signal Cbn is at a high level "H", the nMOS transistor 42 is ON and current flows to the pMOS transistor 43, and the current Ibn flows through the pMOS transistor 44 connected to the pMOS transistor 43 in a current-mirror configuration. That is, when the control signal Cbn is at the high level "H", the current Ibn flows from the high potential power supply line (Vdd) to the low potential power supply line (Vss: the source electrode of the nMOS transistor 2) via the pMOS transistor 44, the p-well 20 (Vbn), and the diode 21. Here, when the control signal Cbn is at the high level "H", the nMOS transistor 40 is OFF because the control signal Cbn whose level is inverted to the low level "L" by the inverter 41 is applied to the gate of the nMOS transistor 40.

On the other hand, when the control signal Cbn is at the low level "L", the nMOS transistor 42 is OFF and the nMOS transistor 40 is ON, so that the low potential supply voltage Vss is applied to the back gate (p-well 20) of the nMOS transistor 2.

Likewise, the current source 3 comprises an inverter 31, PMOS transistors 30 and 32, and nMOS transistors 33 and 34. When a control signal Cbp is at a low level "L", the pMOS transistor 32 is ON, current flows to the nMOS transistor 33, and the current Ibp flows through the nMOS transistor 34 connected to the nMOS transistor 33 in a current-mirror configuration. That is, when the control signal Cbp is at the low level "L", the current Ibp flows from the high potential power supply line (Vdd: the source electrode of the PMOS transistor 1) to the low potential power supply line (Vss) via the diode 11, the n-well 10 (Vbp), and the nMOS transistor 34. Here, when the control signal Cbp is at the low level "L", the pMOS transistor 30 is OFF because the control signal Cbp whose level is inverted to the high level "H" by the inverter 31 is applied to the gate of the pMOS transistor 30.

On the other hand, when the control signal Cbp is at the high level "H", the pMOS transistor 32 is OFF and the pMOS transistor 30 is ON, so that the high potential supply voltage Vdd is applied to the back gate (n-well 10) of the pMOS transistor 1.

Figure 8:
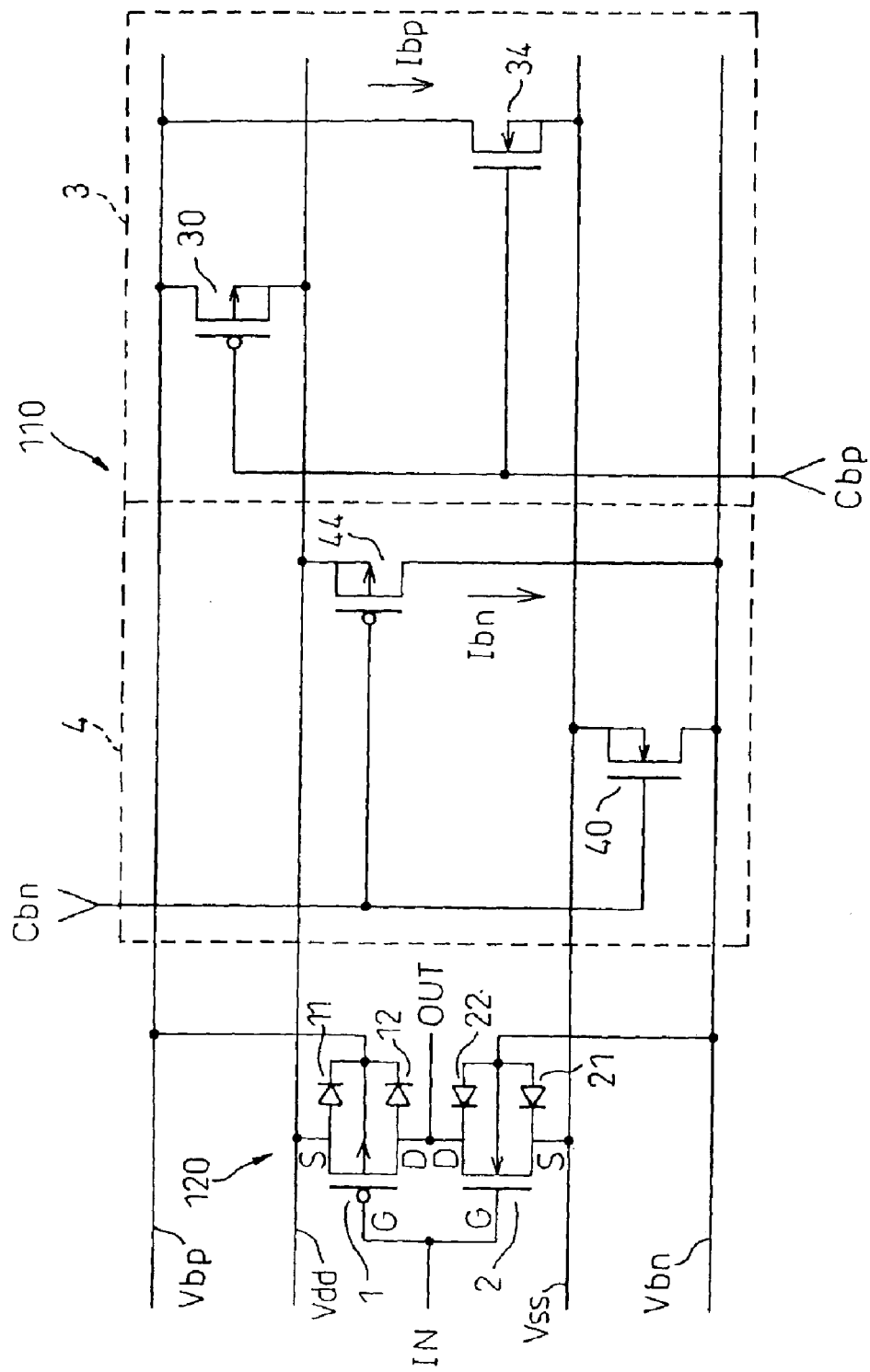
FIG. 8 is a circuit diagram showing another configuration example of the semiconductor integrated circuit device shown in FIG. 6.

FIG. 8 is a circuit diagram showing another configuration example of the semiconductor integrated circuit device shown in FIG. 6; another example of the body biasing circuit 110 (current sources 3 and 4) is shown here.

As is apparent from a comparison between FIG. 8 and FIG. 7, in the configuration example, the current source 4 comprises the nMOS transistor 40 and the pMOS transistor 44, and when the control signal Cbn is at the low level "L", the nMOS transistor 40 is OFF and the pMOS transistor 44 is ON, so that the current Ibn flows through the pMOS transistor 44. On the other hand, when the control signal Cbn is at the high level "H", as the nMOS transistor 40 is ON, the low potential supply voltage Vss is applied to the back gate (p-well 20) of the nMOS transistor 2.

Likewise, the current source 3 comprises the nMOS transistor 34 and the pMOS transistor 30, and when the control signal Cbp is at the high level "H", the pMOS transistor 30 is OFF and the nMOS transistor 34 is ON, so that the current Ibp flows through the nMOS transistor 34. On the other hand, when the control signal Cbp is at the low level "L", because the pMOS transistor 30 is ON, the high potential supply voltage Vdd is applied to the back gate (n-well 10) of the pMOS transistor 1.

As can be seen, though the body biasing circuit 110 (current sources 3 and 4) shown in FIG. 8 is somewhat inferior to the body biasing circuit shown in FIG. 7 in the stability of the current sources 3 and 4, the circuit configuration can be simplified by omitting the nMOS transistors 33 and 42, pMOS transistors 32 and 43, and inverters 31 and 41 from the body biasing circuit of FIG. 7. In the current sources 3 and 4 shown in FIG. 8, the relationship of the logic levels of the control signals Cbp and Cbn to the circuit operation is opposite to the relationship of the logic levels of the control signals Cbp and Cbn to the circuit operation in the current sources 3 and 4 shown in FIG. 7.

As described above, in the circuits of FIG. 7 or 8, generation of the body bias voltages Vbn and Vbp is controlled based on the levels of the control signals Cbn and Cbp, respectively. Here, the control signals Cbn and Cbp can each be constructed as a 1-bit signal. Further, the body biasing circuit 110 need only be provided, for example, for each circuit block or each functional circuit, as will be described later, and the circuit can be constructed with simple circuitry without taking up much chip area. It will also be appreciated that the circuit configuration is not limited to the example shown in FIG. 7 or 8, but may be modified in various ways.

Figure 9:
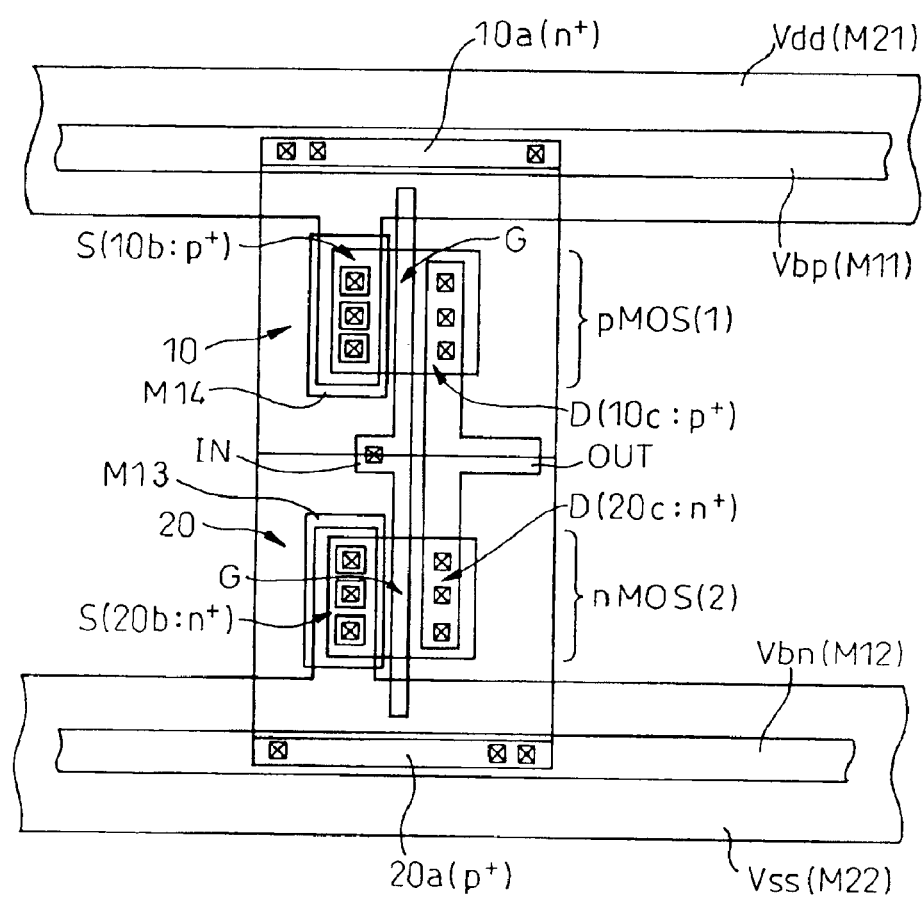
FIG. 9 is a diagram showing one example of the layout pattern of an inverter section in the semiconductor integrated circuit device according to the present invention.
Figure 10:
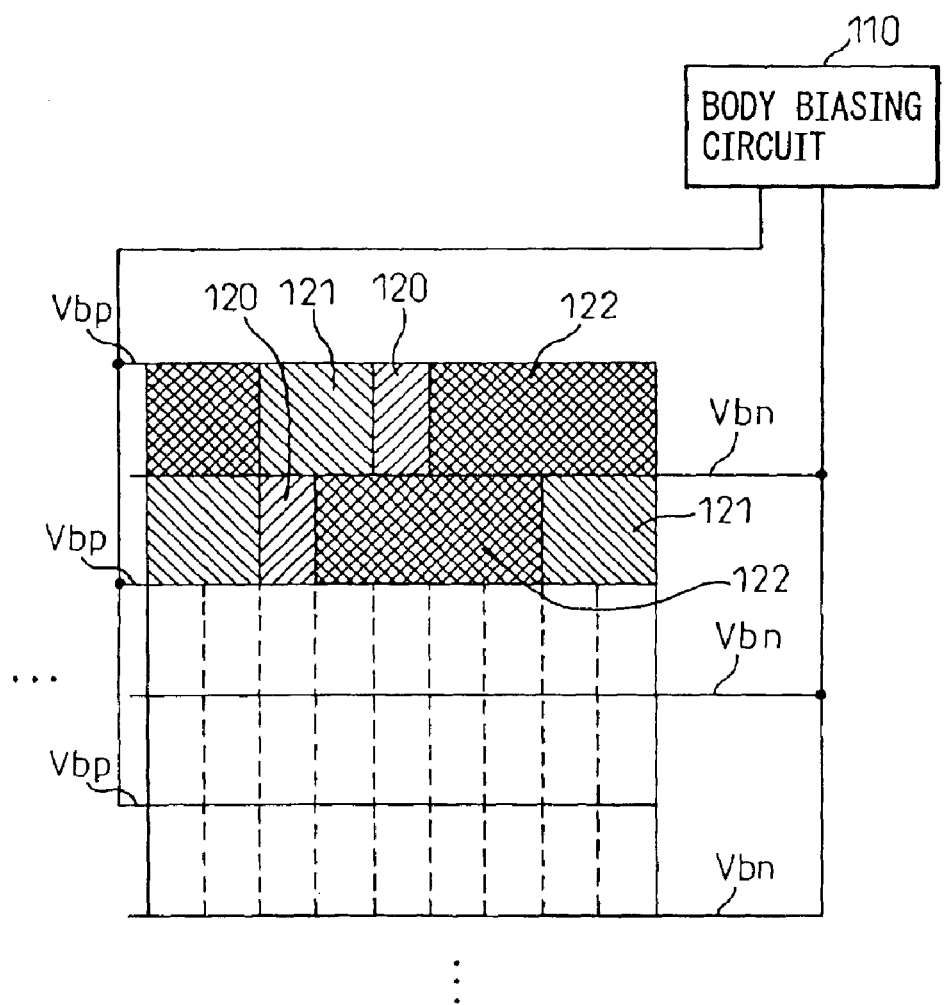
FIG. 10 is a diagram schematically showing one example of a semiconductor integrated circuit device having a plurality of inverter sections each identical to the one shown in FIG. 9.

FIG. 9 is a diagram showing one example of the layout pattern of the inverter section in the semiconductor integrated circuit device according to the present invention, and FIG. 10 is a diagram schematically showing one example of a semiconductor integrated circuit device having a plurality of inverter sections each identical to the one shown in FIG. 9.

As shown in FIG. 4 and FIGS. 6 to 9, the bias voltage Vbn is applied to the p-well 20 (contact region; p$^+$ diffusion region 20a) of the nMOS transistor 2, and the bias voltage Vbp is applied to the n-well 10 (contact region; n$^+$ diffusion region 10a) of the pMOS transistor 1; these bias voltages Vbn and Vbp are connected to the body biasing circuit 110, for example, via metal wiring line M12, M13 and M11, M14, respectively, in the first layer. Here, the high potential power supply lines (Vdd) and the low potential power supply lines (Vss) are respectively connected in common, for example, by respective metal wiring lines M21 and M22 in the second layer.

Further, as shown in FIGS. 9 and 10, gates such as a plurality of inverter sections (CMOS patterns) 120, NAND sections 121, and exclusive OR (EOR) sections 122, for example, are orderly arranged in each circuit block, and the bias voltages (Vbn and Vbp) from the body biasing circuit 110 are supplied to the respective gates 120, 121, 122, etc.

Figure 11:
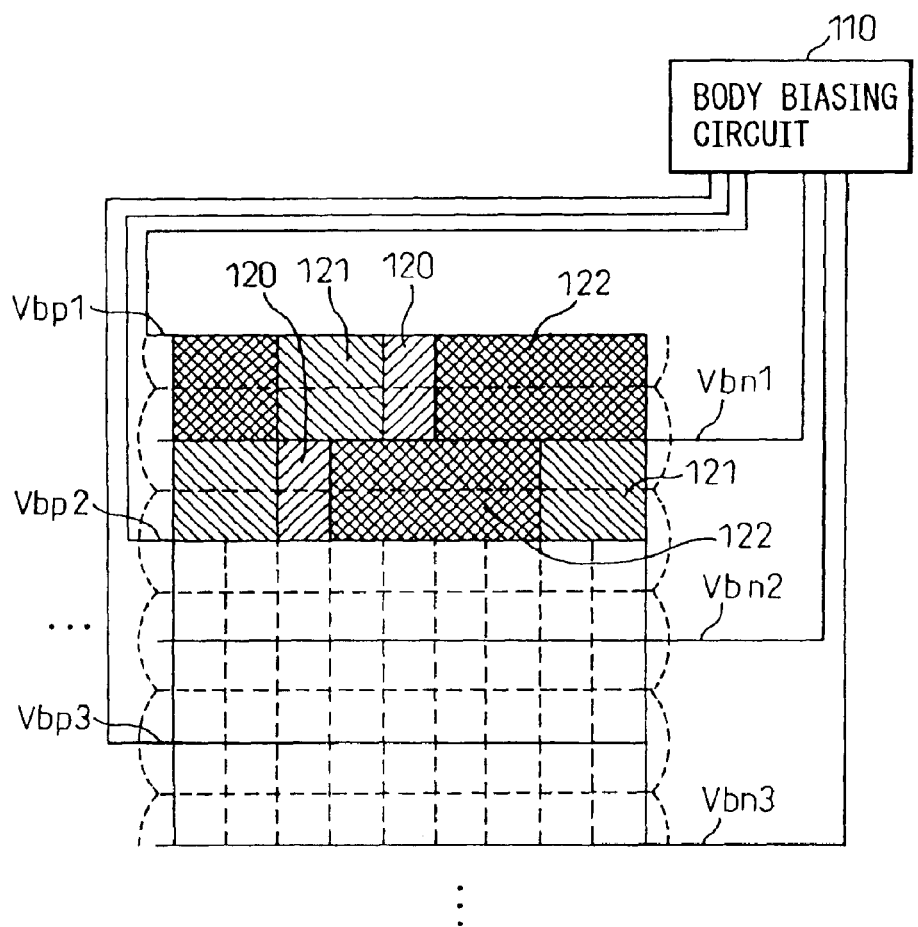
FIG. 11 is a diagram schematically showing a modified example of the semiconductor integrated circuit device shown in FIG. 10.

FIG. 11 is a diagram schematically showing a modified example of the semiconductor integrated circuit device shown in FIG. 10.

As is apparent from a comparison between FIGS. 11 and 10, in the modified example, the bias voltages (Vbn1, Vbn2, Vbn3, . . . ; Vbp1, Vbp2, Vbp3, . . . ) to the respective logic gates (inverter sections 120, NAND sections 122, EOR sections 122, etc.) are independently output from the body biasing circuit 110. That is, in the semiconductor integrated circuit device of FIG. 10, only one bias voltage pair Vbn, Vbp is output from the body biasing circuit 110 but, in the modified example shown in FIG. 11, a plurality of bias voltage pairs Vbn1, Vbp1; Vbn2, Vbp2; Vbn3, Vbp3; . . . are output from the body biasing circuit 110, so that more precise control can be achieved.

Figure 12:
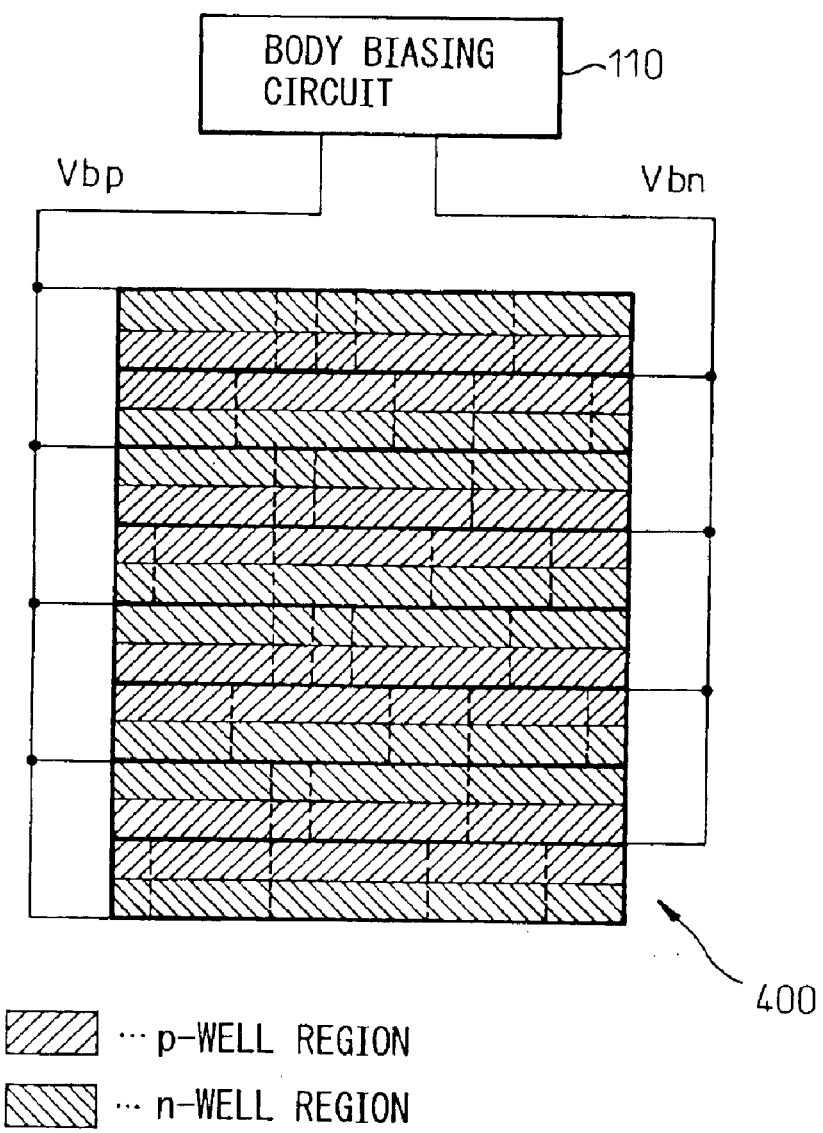
FIG. 12 is a diagram schematically showing another example of the semiconductor integrated circuit device having a plurality of inverter sections each identical to the one shown in FIG. 9.
Figure 13:
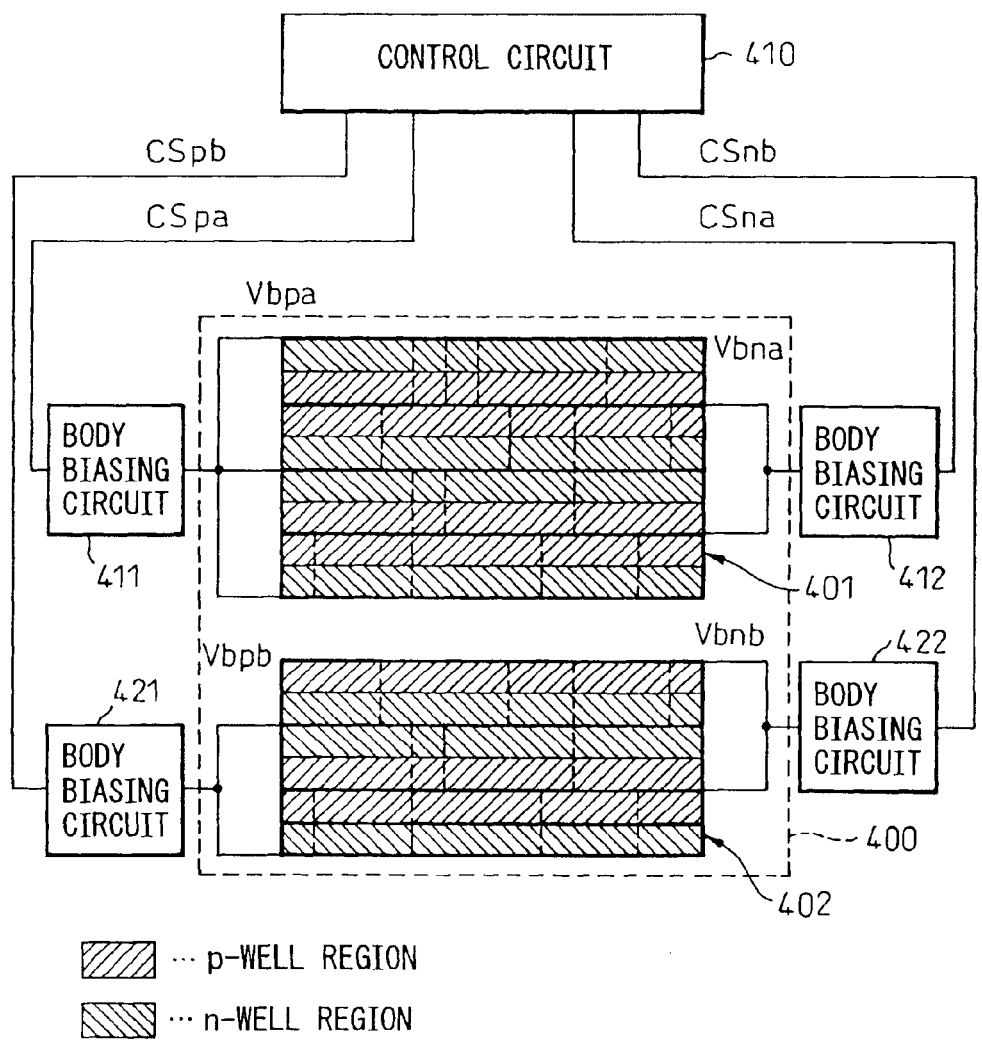
FIG. 13 is a diagram schematically showing a modified example of the semiconductor integrated circuit device shown in FIG. 12.
Figure 14:
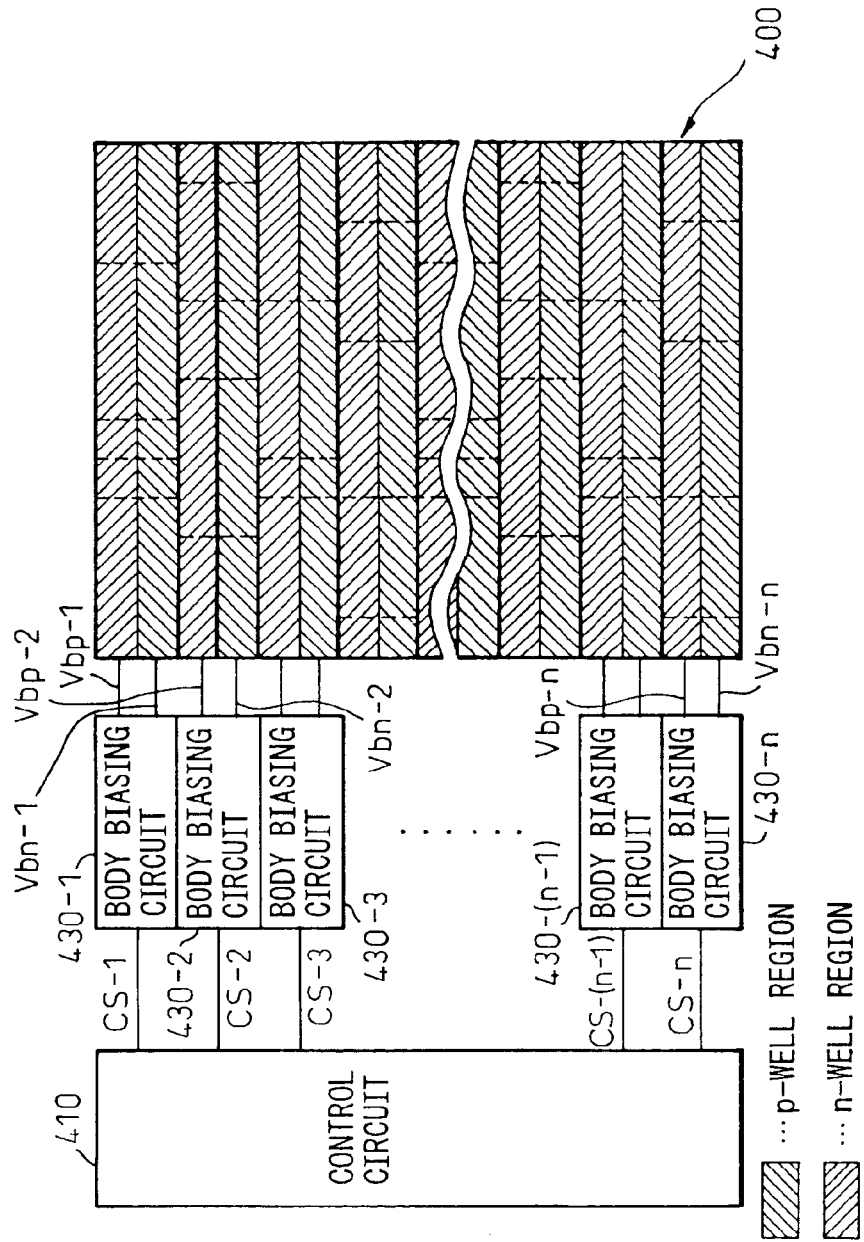
FIG. 14 is a diagram schematically showing another modified example of the semiconductor integrated circuit device shown in FIG. 12.

FIG. 12 is a diagram schematically showing another example of the semiconductor integrated circuit device having a plurality of inverter sections each identical to the one shown in FIG. 9; FIG. 13 is a diagram schematically showing a modified example of the semiconductor integrated circuit device shown in FIG. 12; and FIG. 14 is a diagram schematically showing another modified example of the semiconductor integrated circuit device shown in FIG. 12. In each of the semiconductor integrated circuit devices shown in FIGS. 12 to 14, the bias voltages are controlled by noting the arrangement of pMOS transistors and nMOS transistors arrayed in the row direction in each logic gate (each CMOS circuit). In each CMOS circuit, the transistors of the same conductivity type (p-channel type or n-channel type) are usually arranged in the row direction and, except in the embodiment of FIG. 14, the transistors of the same conductivity type in two adjacent CMOS circuits are formed in such a manner as to be adjacent each other in the column direction between the two CMOS circuits. More specifically, in the semiconductor integrated circuit device comprising CMOS circuits, the well region of the same conductivity type (n-well or p-well) is shared between two CMOS circuits adjacent in the column direction, and the same bias voltage is applied to the well region of this same conductivity type.

The semiconductor integrated circuit device shown in FIG. 12 is similar to the semiconductor integrated circuit devices shown in FIGS. 10 and 11, but is drawn from a different viewpoint; that is, one body biasing circuit 110 is provided for a standard cell block 400 that forms the semiconductor integrated circuit device, and the bias voltages Vbp and Vbn are applied from the body biasing circuit 110 to the p-well regions and the n-well regions, respectively, in the standard cell block 400.

In the semiconductor integrated circuit device shown in FIG. 13, the standard cell block 400 is divided into a plurality of (two) groups 401 and 402, and body biasing circuits 411, 412 and 421, 422 are provided for the respective cell groups 401 and 402. Here, in the semiconductor integrated circuit device shown in FIG. 13, the body biasing circuits 411 and 421 for the p-well regions and the body biasing circuits 412 and 422 for the n-well regions are provided for the respective cell groups 401 and 402, and the body bias voltages Vbpa, Vbpb and Vbna, Vbnb are controlled by the respective control signals CSpa, CSpb and CSna, CSnb supplied from the control circuit 410.

In the semiconductor integrated circuit device shown in FIG. 14, transistors of different conductivity types are formed adjacent to each other; in this case, the body bias voltage for each adjacent region can be controlled independently of the other. Body biasing circuits 430-1 to 430-n are provided one for each row of the standard cell block 400, and the body bias voltages Vbp-1, Vbn-1 to Vbp-n, Vbn-n are controlled by the respective control signals CS-1 to CS-n supplied from the control circuit 410.

In this way, the arrangement of the standard cell block and the body biasing circuits (and the control circuit) can be modified, variously, as needed. For the body biasing circuit configuration, the circuit configuration shown in FIGS. 7 or 8 can be applied in its entirety.

Figure 15:
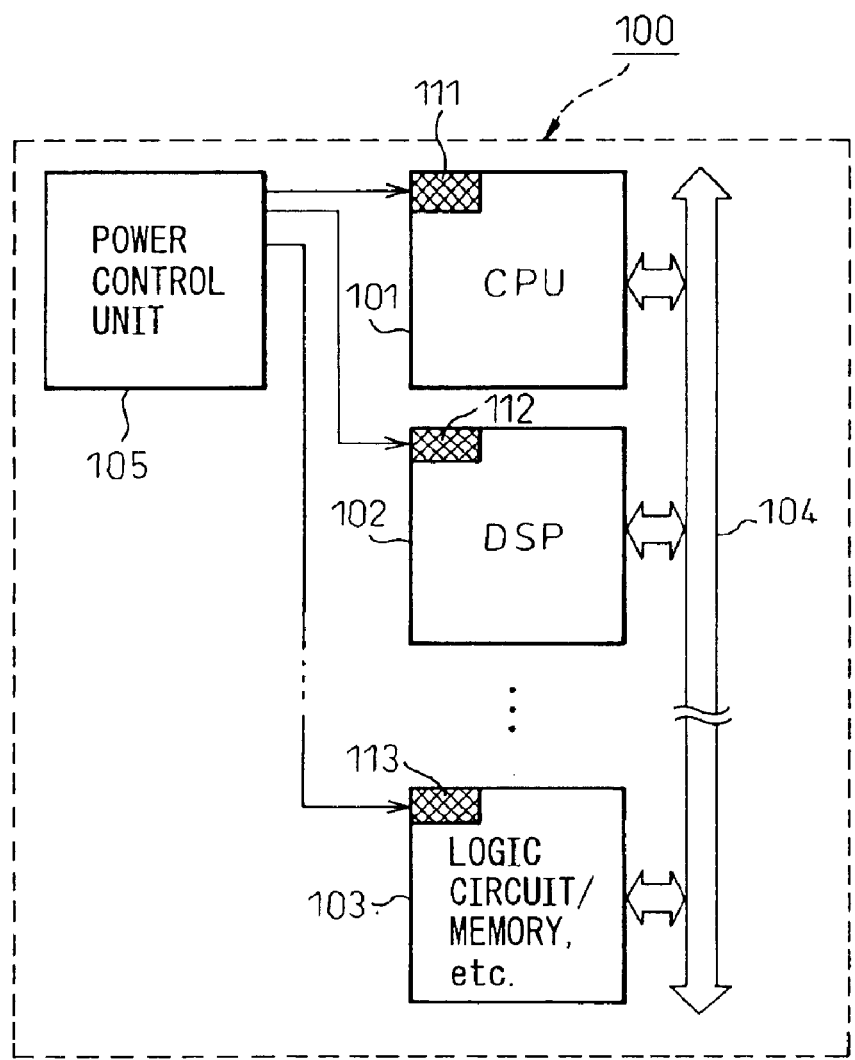
FIG. 15 is a block diagram showing the entire configuration of one example of the semiconductor integrated circuit device to which the present invention is applied.

FIG. 15 is a block diagram showing the entire configuration of one example of the semiconductor integrated circuit device to which the present invention is applied. In FIG. 15, reference numeral 100 is the semiconductor integrated circuit device (one-chip IC); 101 to 103 are circuit blocks, that is, 101 is a CPU (Central Processing Unit), 102 is a DSP (Digital Signal Processor), and 103 is other circuit block such as a logic circuit, memory circuit, etc.; 104 is a bus; 105 is a power control unit; and 111 to 113 are body biasing circuits.

As shown in FIG. 15, the respective circuit blocks 101 to 103 are interconnected via the bus 104, and transfer various data and signals among them. The circuit blocks 101 to 103 are respectively provided with the body biasing circuits 111 to 113 which are controlled by control signals from the power control unit 105, and the body biasing circuit only for the necessary circuit block is activated according to the operating state of the semiconductor integrated circuit device 100. Here, the body biasing circuits 111 to 113 can each be constructed employing the circuit configuration described with reference to FIG. 7, and can be controlled according to the level, i.e., the high level "H" or the low level "L", of the control signal ("1" or "0" of the one-bit control signal) supplied from the power control unit 105.

That is, the body biasing circuits 111 to 113, small in size and simple in configuration, are provided for the respective circuit blocks 101 to 103 and, by controlling the operation of the body biasing circuits 111 to 113 by the respective one-bit control signals according to the operating stats, the power consumption can be further reduced.

Figure 16:
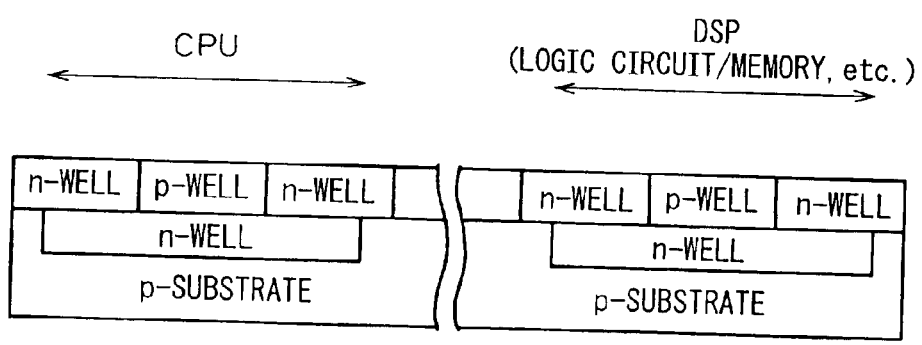
FIG. 16 is a diagram schematically showing a cross section of the semiconductor integrated circuit device shown in FIG. 15.

FIG. 16 is a diagram schematically showing a cross section of the semiconductor integrated circuit device shown in FIG. 15.

As shown in FIG. 16, the semiconductor integrated circuit device (one-chip IC) 100 having the plurality of circuit blocks 101 to 103 shown in FIG. 15 is constructed, for example, in a triple well structure, and the respective circuit blocks (CPU 101, DSP 102, and logic circuit/memory circuit 103, etc.) are electrically insulated from one another. With this structure, the operation of the circuit blocks 101 to 103 is controlled independently of one another by the corresponding body biasing circuits 111 to 113.

Figure 17:
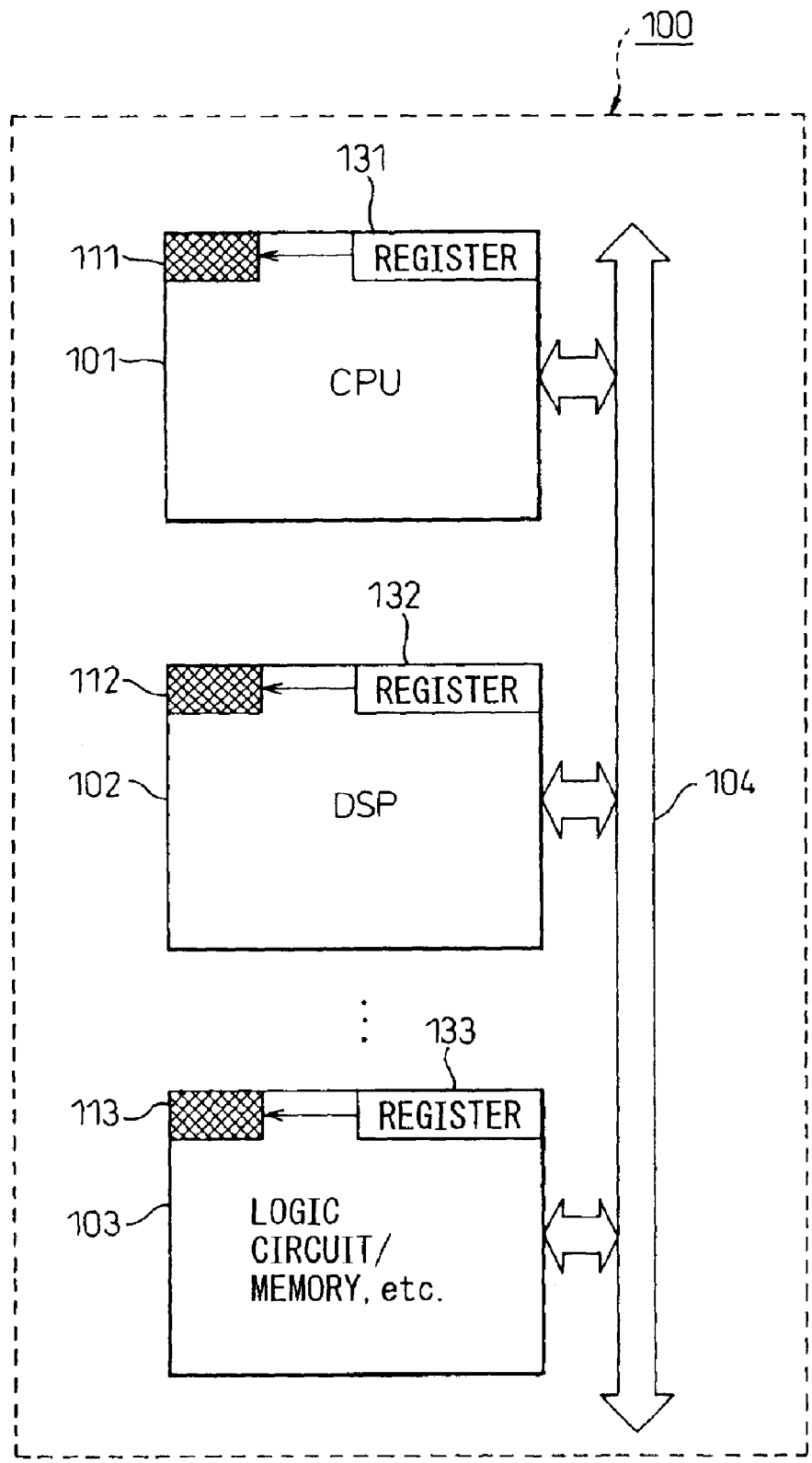
FIG. 17 is a block diagram showing the entire configuration of another example of the semiconductor integrated circuit device to which the present invention is applied.

FIG. 17 is a block diagram showing the entire configuration of another example of the semiconductor integrated circuit device to which the present invention is applied.

As shown in FIG. 17, a CPU 101 comprises a resistor 131 and a body biasing circuit 111. The body biasing circuit 111 is controlled in accordance with data stored in the register 131. Similarly, a DSP 102 comprises a register 132 and a body biasing circuit 112 which is controlled in accordance with data stored in the register 132, and logic circuit/memory circuit etc. 103 comprises a register 133 and a body biasing circuit 113 which is controlled in accordance with data stored in the register 133. The power control operation, which is constituted as a software module, is carried out at the CPU 101. Specifically, the soft ware module is fetched in a cache memory of the CPU 101 or a memory outside of the CPU 101. The registers 112 and 113 are connected to the data bus 104, and the data of each register 112, 113 are written from the CPU 101 through the data bus 104.

In accordance with this example, power management scheme (power consumption controlling) can be easily changed, and therefore, the power management is easily customized depending on structure or application running on the one-chip IC 100.

Figure 18:
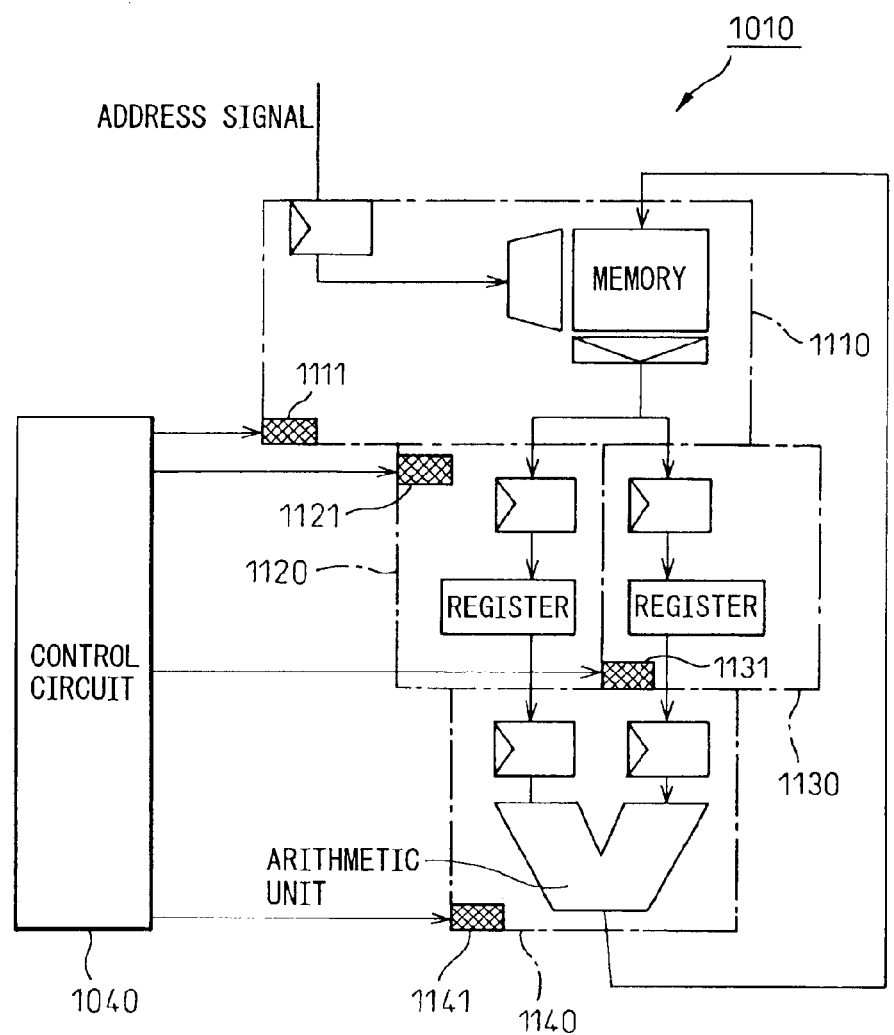
FIG. 18 is a block diagram showing the configuration of a portion in a still another example of the semiconductor integrated circuit device to which the present invention is applied.

FIG. 18 is a block diagram showing the configuration of a portion in a still another example of the semiconductor integrated circuit device to which the present invention is applied; the diagrams shows, for example, a CPU 1010 (corresponding to the CPU 101 shown in FIG. 15).

As shown in FIG. 18, the CPU 1010 comprises a plurality of functional blocks 1110 to 1140, and body biasing circuits 1111 to 1141 are provided for the respective functional blocks 1110 to 1140. More specifically, the memory block body biasing circuit 1111 is provided for the memory block 1110, the register block body biasing circuits 1121 and 1131 are provided for the register blocks 1120 and 1130, respectively, and the arithmetic block body biasing circuit 1141 is provided for the arithmetic block 1140. The body biasing circuits 1111 to 1141 control the body bias voltages (Vbp and Vbn) in the corresponding functional blocks 1110 to 1140 by the respective functional block control signals supplied from the control circuit 1040.

In this way, the body bias voltages (Vbp and Vbn) can be controlled more precisely by performing control for each functional block in each circuit block (for example, the CPU), not by performing control for each circuit block, such as the CPU 101 and the DSP 102, as in FIG. 15.

Figure 19:
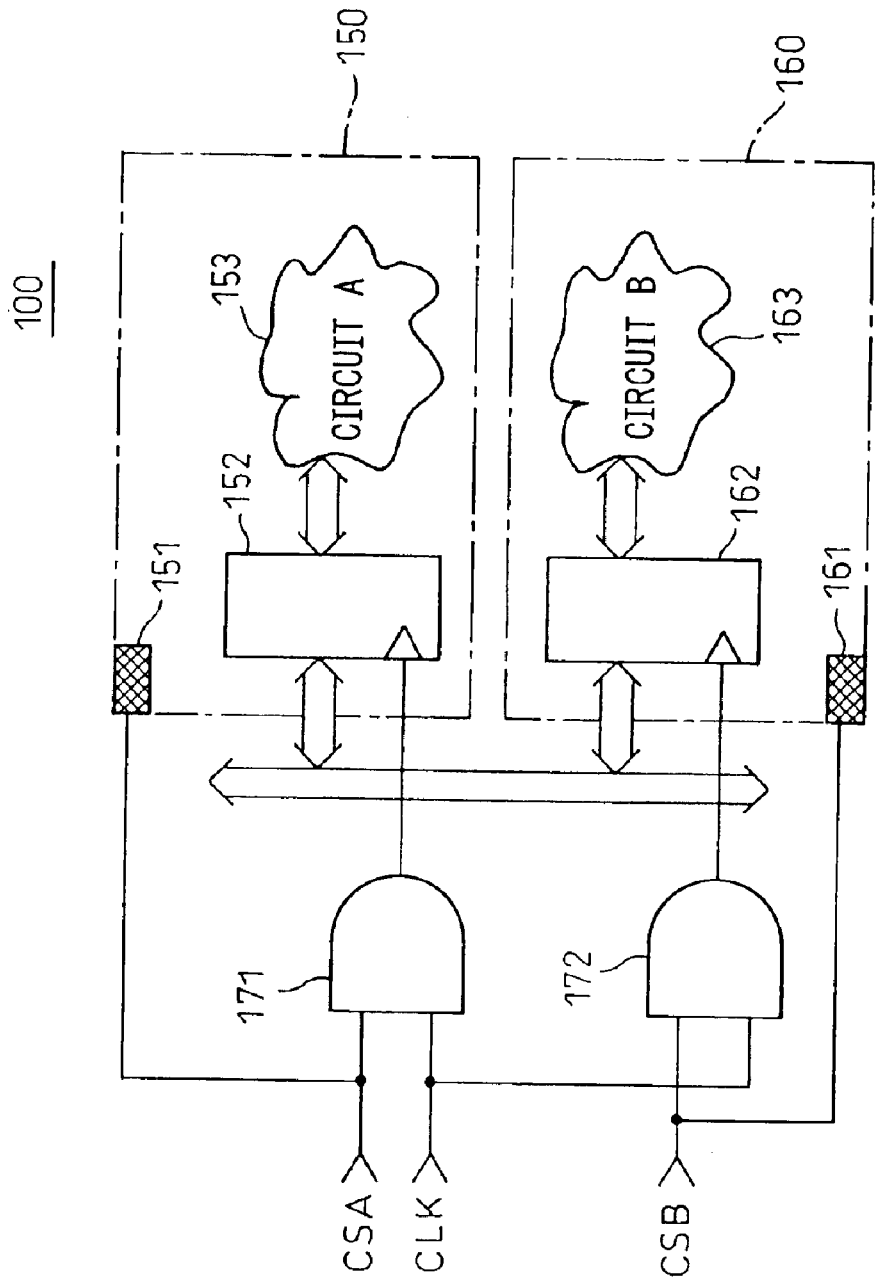
FIG. 19 is a block diagram schematically showing a still another configuration example of the semiconductor integrated circuit device to which the present invention is applied.

FIG. 19 is a block diagram schematically showing a still another configuration example of the semiconductor integrated circuit device to which the present invention is applied; that is, one example of a circuit combined with a gated clock circuit is schematically shown here.

As shown in FIG. 19, in the semiconductor integrated circuit device, logic outputs taken between a clock signal CLK and control signals CSA and CSB, respectively, are supplied as clocks to a circuit A (153) in a circuit block 150 and a circuit B (163) in a circuit block 160, respectively. More specifically, the output signal of an AND gate 171 which ANDs the control signal CSA with the clock signal CLK is supplied, for example, to the clock input of a flip-flop 152 in the circuit block 150, while the output signal of an AND gate 172 which ANDs the control signal CSB with the clock signal CLK is supplied to the clock input of a flip-flop 162 in the circuit block 160. Further, the circuit block 150 is provided with a body biasing circuit 151 which is controlled by the control signal CSA; likewise, the circuit block 160 is provided with a body biasing circuit 161 which is controlled by the control signal CSB.

That is, the body biasing circuits 151 and 161 are provided for the respective circuit blocks 150 and 160, and the control signals CSA and CSB for the gated clock circuit are also used as the control signals for the body biasing circuits 151 and 161. The effect of this is that when there is no need to operate the respective circuit blocks 150 and 160, not only can AC power be reduced by stopping the clocks to be input to the respective flip-flops 152 and 162 based on the respective control signals CSA and CSB, but leakage power can also be reduced by controlling the body bias by means of the respective body biasing circuits 151 and 161.

Incidentally, it is known in the art that, in a low-voltage CMOS circuit, delay decreases as the temperature increases. Specifically, in K. Kanda et al., "Design Impact of Positive Temperature Dependence on Drain Current in Sub-1-V CMOS VLSI, " IEEE J. Solid-State Circuits, vol. 36, No, 10, pp. 1559–1564, October 2001, it is reported that when the CMOS circuit is operated with a voltage lower than the ZTC (Zero-Temperature Coefficient) point (for example, with 0.5 V, a voltage lower than 0.7 V), the delay decreases as the temperature increases, unlike the case where it is operated with a high supply voltage (for example, 3.3 V).

Figure 20A:
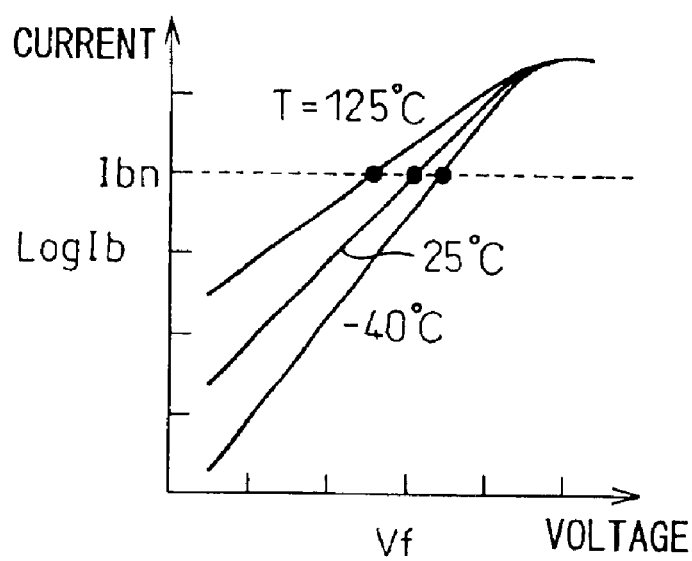
FIGS. 20A and 20B are diagrams for explaining the temperature dependence of transistor delay time.
Figure 20B:
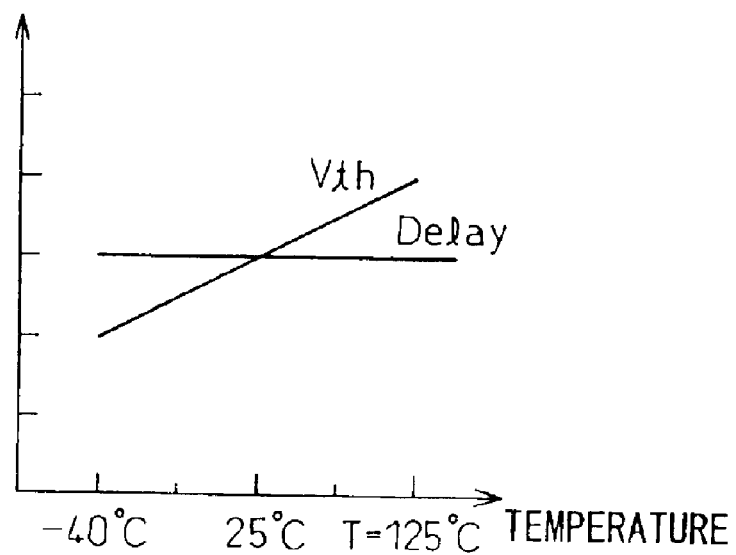

FIGS. 20A and 20B are diagrams for explaining the temperature dependence of the transistor delay time: FIG. 20A shows the relationship between the current Ib flowing through a diode and the generated voltage Vf, and FIG. 20B conceptually shows the case where the present invention is applied to a CMOS circuit operating with a low voltage (for example, a voltage lower than 0.7 V).

In the semiconductor integrated circuit device according to the present invention, as shown in FIG. 20A for example (or as described with reference to FIG. 5), when the current Ib flowing through the diode (that is, the body bias current Ibn flowing through the diode 21 in FIGS. 6 and 7) is held constant, the value of the generated voltage Vf (the body bias voltage Vbn) decreases as the temperature rises.

As a result, the transistor threshold voltage Vth increases with increasing temperature, as shown in FIG. 20B. Accordingly, when the present invention is applied to a CMOS circuit operating with a low voltage, for example, a voltage lower than 0.7 V, the characteristic of the low-voltage operating CMOS circuit that the delay decreases with increasing temperature, as illustrated in the above-cited paper ("Design Impact of Positive Temperature Dependence on Drain Current in Sub-1-V CMOS VLSI"), is cancelled (qualitatively offset) and the delay of the circuit operating speed can be maintained constant against temperature changes.

FIGS. 21 to 24 are diagrams showing measurement results for explaining the operation of the semiconductor integrated circuit device according to the present invention.

Figure 21:
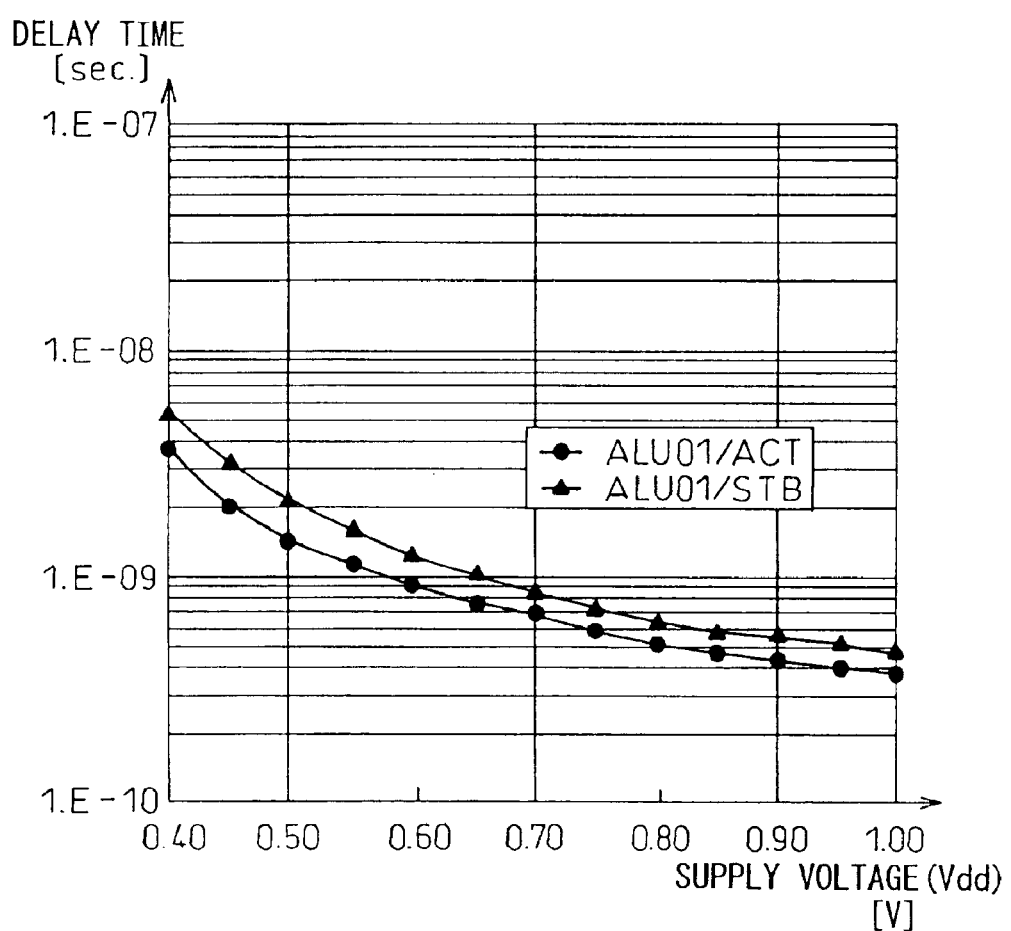
FIG. 21 is a diagram (part 1) showing measurement results for explaining the operation of the semiconductor integrated circuit device according to the present invention.

FIG. 21 is a diagram plotting the delay time as a function of the supply voltage (Vdd), measured when a 32-bit ALU (Arithmetic and Logic Unit) is operated at 27° C., for the case where the body biasing circuit is operated (ALU01/ACT) in comparison with the case where the body biasing circuit is stopped (ALU01/STB).

As can be seen from FIG. 21, over the entire range of the supply voltage Vdd from 0.40 V to 1.00 V, the delay time can be reduced more effectively when the body biasing circuit is operated than when it is not operated.

Figure 22A:
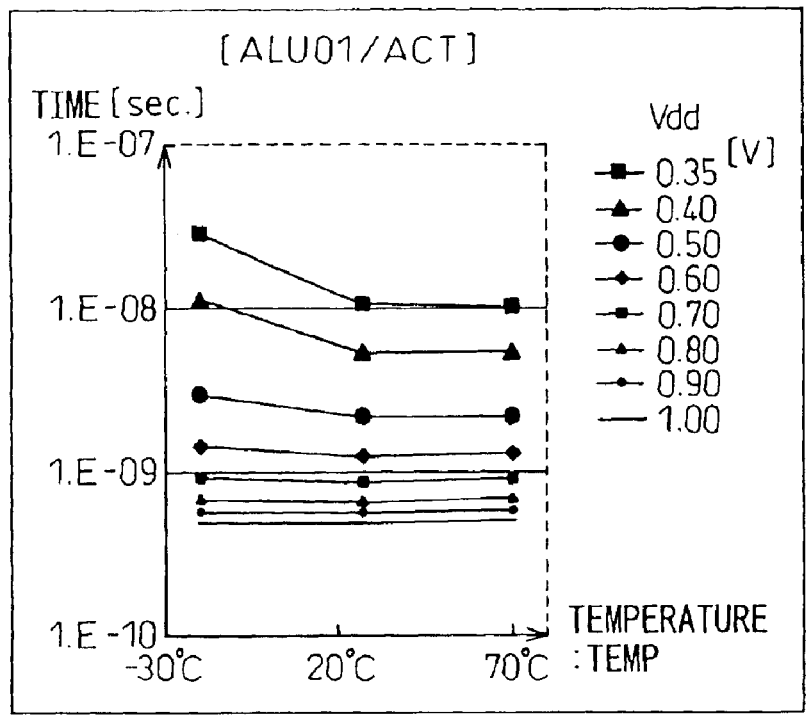
FIGS. 22A and 22B are diagrams (part 2) showing measurement results for explaining the operation of the semiconductor integrated circuit device according to the present invention.
Figure 22B:
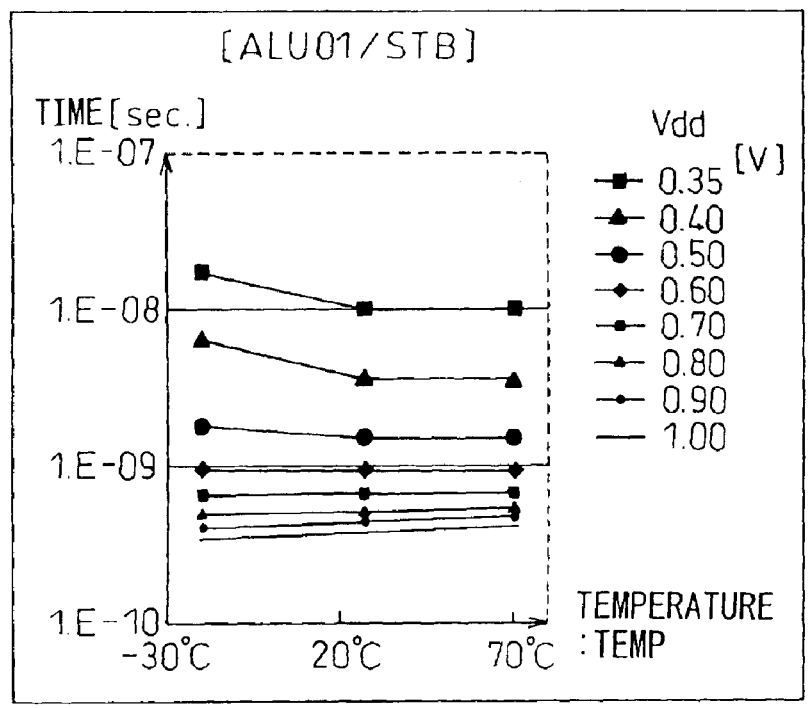

FIGS. 22A and 22B are diagrams showing the delay time measured by operating the 32-bit ALU at various supply voltages Vdd (Vdd=0.35, 0.40, 0.50, 0.60, 0.70, 0.80, 0.90, and 1.00 V) while varying the temperature T: FIG. 22A shows the case where the body biasing circuit is operated (ALU01/Active), and FIG. 22B shows the case where the body biasing circuit is stopped (ALU01/Standby).

As can be seen from a comparison between FIGS. 22A and 22B, the delay time can be reduced more effectively when the body biasing circuit is operated than when it is not operated, regardless of the supply voltage Vdd or the temperature TEMP; in particular, it is shown that the lower the supply voltage Vdd and the lower the operating temperature TEMP, the more pronounced the effect of the delay time reduction.

Figure 23:
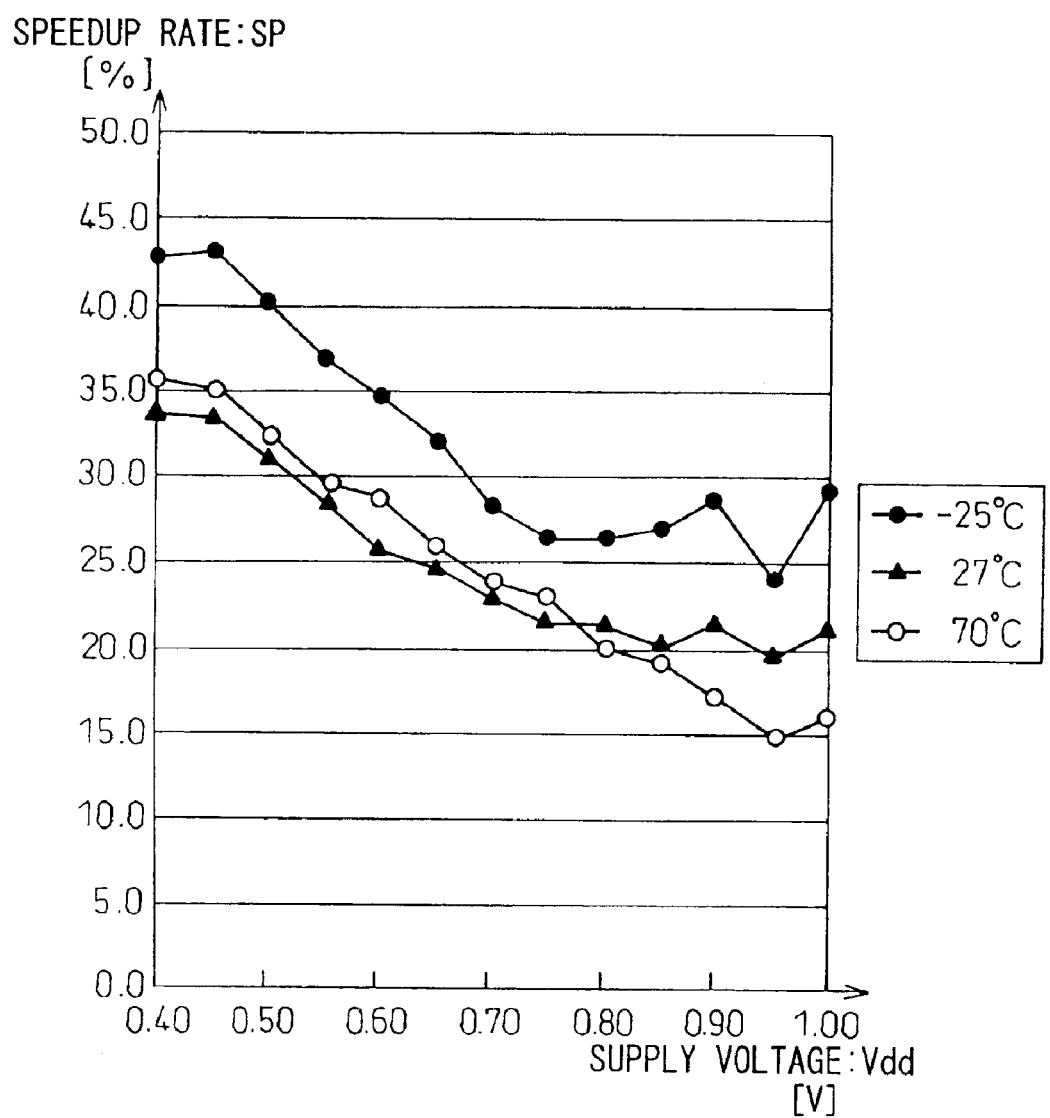
FIG. 23 is a diagram (part 3) showing measurement results for explaining the operation of the semiconductor integrated circuit device according to the present invention.

FIG. 23 shows the speedup rate (percentage) SP achieved when the 32-bit ALU is operated at various temperatures (70° C., 27° C., and −25° C.) while varying the supply voltage Vdd. Here the speedup rate SP is obtained as SP=(1-ACT/STB)×100[%]. Here, ACT is the delay time when the body biasing circuit is operated, and STB is the delay time when the body biasing circuit is not operated.

FIG. 24 is a diagram simulating the generation of the body bias voltage based on the control signal Cbp and the resulting change of the n-well voltage level in the n-well (10) of the pMOS transistor.

As can be seen from FIG. 24, when the control signal Cbp changes at timing P0 (from the low level "L" to the high level "H": refer to FIG. 7), for example, the voltage level of the n-well 10 shown in FIG. 4 immediately drops and settles at timing P1 to the prescribed voltage (Vbn) which means the application of the forward bias voltage. When the control signal Cbp changes from the high level "H" to the low level "L", since the nMOS transistor 42 is turned off and the nMOS transistor 40 is turned on, as earlier described with reference to FIG. 7, the voltage level of the n-well 10 immediately rises back to its original level (Vss). That is, as shown in FIG. 7, for example, the body biasing circuit 110 (current source 3) can quickly respond to the change of the control signal Cbp (for example, a 1-bit signal).

As described in detail above, according to the present invention, a semiconductor integrated circuit device can be provided that has a body biasing circuit that can generate a forward body (well) bias voltage of a suitable level by using simple circuitry.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor integrated circuit device comprising:
    a MISFET, having a source electrode and a drain electrode of a first conductivity type and a gate electrode, formed in a well of a second conductivity type; and
    a body biasing circuit that generates a voltage in said well by passing a prescribed current in a forward direction into a diode formed from said well and said source electrode of said MISFET, said body biasing circuit including a current source provided between a first power supply line and a contact region of said well and passing said prescribed current into said diode via said contact region, and said current source generating said prescribed current using said first power supply line as a power supply source, wherein said current source comprises:
    a current-source first MISFET having the same polarity as said MISFET, and whose gate electrode is supplied with a control signal and whose source electrode is connected to a second power supply line,
    a current-source second MISFET having a different polarity from said MISFET, and whose source electrode is connected to said first power supply line and whose drain electrode and gate electrode are connected to a drain electrode of said current-source first MISFET, and
    a current-source third MISFET connected to said current-source second MISFET in a current-mirror configuration, and whose drain is connected to said contact region.

2. The semiconductor integrated circuit device as claimed in claim 1, wherein:
    said semiconductor integrated circuit device comprises a plurality of circuit blocks; and
    said body biasing circuit is provided for each of said circuit blocks.

3. The semiconductor integrated circuit device as claimed in claim 2, further comprising a power control unit which controls said body biasing circuit individually for each corresponding one of said circuit blocks.

4. The semiconductor integrated circuit device as claimed in claim 2, a power control soft ware module is carried out on a CPU, and controls said body biasing circuit individually for each corresponding one of said circuit blocks.

5. The semiconductor integrated circuit device as claimed in claim 4, wherein said each circuit block comprises a register, and said each body biasing circuit is controlled in accordance with data stored in said register.

6. The semiconductor integrated circuit device as claimed in claim 5, wherein said each circuit block is connected to a data bus, the data of said resister being written through said data bus.

7. The semiconductor integrated circuit device as claimed in claim 1, wherein:
    said semiconductor integrated circuit device comprises a plurality of circuit blocks; and
    said body biasing circuit is provided for each of said circuit blocks, and is controlled by a control signal generated for a corresponding one of said circuit blocks.

8. The semiconductor integrated circuit device as claimed in claim 1, wherein:
    said semiconductor integrated circuit device comprises a plurality of circuit blocks;

said circuit block includes a plurality of functional blocks; and said body biasing circuit is provided for each of said functional blocks.

9. The semiconductor integrated circuit device as claimed in claim 1, wherein:

said semiconductor integrated circuit device comprises a standard cell block; and said body biasing circuit is provided for each row of said standard cell block.

10. The semiconductor integrated circuit device as claimed in claim 1, wherein said current source further comprises:

a current-source fourth MISFET having the same polarity as said MISFET, and whose gate electrode is supplied with an inverted version of said control signal and whose source electrode is connected to said contact region and whose drain electrode is connected to said second power supply line.

11. A semiconductor integrated circuit device, comprising:

a MISFET having a source electrode and a drain electrode of a first conductivity type and a gate electrode, formed in a well of a second conductivity type; and a body biasing circuit that generates a voltage in said well by passing a prescribed current in a forward direction into a diode formed from said well and said source electrode of said MISFET, said body biasing circuit including a current source provided between a first power supply line and a contact region of said diode via said contact region, and said current source generating said prescribed current using said first power supply line as a power supply source, wherein said current source comprises:

a current-source fifth MISFET having a different polarity from said MISFET, and whose gate electrode is supplied with a control signal and whose source electrode is connected to said first power supply line, and a current-source sixth MISFET having the same polarity as said MISFET, and whose gate electrode is supplied with said control signal and whose source electrode is connected to said contact region and whose drain electrode is connected to a second power supply line.

12. The semiconductor integrated circuit device as claimed in claim 1, wherein an operation delay is made constant against temperature changes by operating said semiconductor integrated circuit device with a low voltage at which said semiconductor integrated circuit device exhibits a characteristic that a leakage current increases and the delay decreases with increasing temperature.

13. A semiconductor integrated circuit device comprising:

a first MISFET of a first polarity, having a source electrode and a drain electrode of a first conductivity type and a gate electrode, formed in a first well of a second conductivity type;

a second MISFET of a second polarity, having a source electrode and drain electrode of said second conductivity type and a gate electrode, formed in a second well of said first conductivity type;

a first body biasing circuit that generates a voltage in said first well by passing a prescribed current in a forward direction into a diode formed from said first well and said source electrode of said first MISFET; and a second body biasing circuit that generates a voltage in said second well by passing a prescribed current in a forward direction into a diode formed from said second well and said source electrode of said second MISFET, wherein:

said first body biasing circuit includes a first current source, provided between a first power supply line and a contact region of said first well, and passes said prescribed current into said first diode via said contact region of said first well, said second body biasing circuit includes a second current source, provided between a second power supply line and a contact region of said second well, and passes said prescribed current into said second diode via said contact region of said second well, said first current source generates said prescribed current using said first power supply line as a power supply source, and said second current source generates said prescribed current using said second power supply line as a power supply source; said first current source comprises:

a first-current-source first MISFET having the same polarity as said first MISFET, and whose gate electrode is supplied with a first control signal and whose source electrode is connected to said second power supply line, a first-current-source second MISFET having a different polarity from said first MISFET, and whose source electrode is connected to said first power supply line and whose drain electrode and gate electrode are connected to a drain electrode of said first-current-source first MISFET, and a first-current-source third MISFET connected to said first-current-source second MISFET in a current-mirror configuration, and whose drain is connected to said contact region of said first well; and said second current source comprises:

a second-current-source first MISFET having the same polarity as said second MISFET, and whose gate electrode is supplied with a second control signal and whose source electrode is connected to said first power supply line, a second-current-source second MISFET having a different polarity from said second MISFET, and whose source electrode is connected to said second power supply line and whose drain electrode and gate electrode are connected to a drain electrode of said second-current-source first MISFET, and a second-current-source third MISFET connected to said second-current-source second MISFET in a current-mirror configuration, and whose drain is connected to said contact region of said second well.

14. The semiconductor integrated circuit device as claimed in claim 13, wherein:

said semiconductor integrated circuit device comprises a plurality of circuit blocks; and said first and second body biasing circuits are provided for each of said circuit blocks.

15. The semiconductor integrated circuit device as claimed in claim 14, further comprising a power control unit which controls said first and second body biasing circuits individually for each corresponding one of said circuit blocks.

16. The semiconductor integrated circuit device as claimed in claim 14, a power control soft ware module is carried out on a CPU, and controls said body biasing circuit individually for each corresponding one of said circuit blocks.

17. The semiconductor integrated circuit device as claimed in claim 16, wherein said each circuit block comprises a register, and said each body biasing circuit is controlled in accordance with data stored in said register.

18. The semiconductor integrated circuit device as claimed in claim 17, wherein said each circuit block is connected to a data bus, the data of said resister being written through said data bus.

19. The semiconductor integrated circuit device as claimed in claim 13, wherein:
said semiconductor integrated circuit device comprises a plurality of circuit blocks; and
said first and second body biasing circuits are provided for each of said circuit blocks, and are controlled by a control signal generated for a corresponding one of said circuit blocks.

20. The semiconductor integrated circuit device as claimed in claim 13, wherein:
said semiconductor integrated circuit device comprises a plurality of circuit blocks;
said circuit block includes a plurality of functional blocks; and
said first and second body biasing circuits are provided for each of said functional blocks.

21. The semiconductor integrated circuit device as claimed in claim 13, wherein:
said semiconductor integrated circuit device comprises a standard cell block, and
said first and second body biasing circuits are provided for each row of said standard cell block.

22. The semiconductor integrated circuit device as claimed in claim 13, wherein:
said first current source further comprises a first-current-source fourth MISFET having the same polarity as said first MISFET and whose gate electrode is supplied with an inverted version of said first control signal and whose source electrode is connected to said contact region of said first well and whose drain electrode is connected to said second power supply line; and
said second current source further comprises a second-current-source fourth MISFET having the same polarity as said second MISFET, and whose gate electrode is supplied with an inverted version of said second control signal and whose source electrode is connected to said contact region of said second well and whose drain electrode is connected to said first power supply line.

23. A semiconductor integrated circuit device, comprising:
a first MISFET of a first polarity, having a source electrode and a drain electrode of a first conductivity type and a gate electrode, formed in a first well of a second conductivity type;
a second MISFET of a second polarity, having a source electrode and drain electrode of said second conductivity type and a gate electrode, formed in a second well of said first conductivity type;
a first body biasing circuit that generates a voltage in said first well by passing a prescribed current in a forward direction into a diode formed from said first well and said source electrode of said first MISFET; and
a second body biasing circuit that generates a voltage in said second well by passing a prescribed current in a forward direction into a diode formed from said second well and said source electrode of said second MISFET, wherein:
said first body biasing circuit includes a first current provided between a first power supply line and a contact region of said first well, and passes said prescribed current into said first diode via said contact region of said first well,
said second body biasing circuit includes a second current source provided between a second power supply line and a contact region of said second well, and passes said prescribed current into said second diode via said contact region of said second well,
said first current source generates said prescribed current using said first power supply line as a cower supply source, and
said second current source generates said prescribed current using said second power supply line as a power supply source; said first current source comprises:
a first-current-source fifth MISFET having a different polarity from said first MISFET, and whose gate electrode is supplied with a first control signal and whose source electrode is connected to said first power supply line, and
a first-current-source sixth MISFET having the same polarity as said first MISFET, and whose gate electrode is supplied with said first control signal and whose source electrode is connected to said contact region of said first well and whose drain electrode is connected to said second power supply line; and said second current source comprises:
a second-current-source fifth MISFET having a different polarity from said second MISFET, and whose gate electrode is supplied with a second control signal and whose source electrode is connected to said second power supply line, and
a second-current-source sixth MISFET having the same polarity as said second MISFET, and whose gate electrode is supplied with said second control signal and whose source electrode is connected to said contact region of said second well and whose drain electrode is connected to said first power supply line.

24. The semiconductor integrated circuit device as claimed in claim 13, wherein operation delay is made constant against temperature changes by operating said semiconductor integrated circuit device with a low voltage at which said semiconductor integrated circuit device exhibits a characteristic that a leakage current increases and the delay decreases with increasing temperature.

* * * * *

UNITED STATES PATENT AND TRADEMARK OFFICE
CERTIFICATE OF CORRECTION

PATENT NO. : 6,864,539 B2
DATED : March 8, 2005
INVENTOR(S) : Koichiro Ishibashi et al.

It is certified that error appears in the above-identified patent and that said Letters Patent is hereby corrected as shown below:

Title page,
Item [75], Inventors, change "Koichiro Ishibashi, Warabi (JP)" to -- Koichiro Ishibashi, Warabi-shi (JP) --;
Item [56], References Cited, OTHER PUBLICATIONS, change
"S. Narendra et al., "1.IV IGHz Communications Router with On-Chip Body Bias 150nm CMOS," ISSCC 2002/ Session 16/High Speed I/O 16.4, pp. 270, 271,466, Feb. 2002." to -- S. Narendra et al., "1.IV IGHz Communications Router with On-Chip Body Bias 150nm CMOS," ISSCC 2002/ SESSION 16/HIGH SPEED I/O 16.4, pp. 270, 271,466, Feb. 2002 --.

Column 19,
Line 36, after "MISFET" insert -- , --.

Column 20,
Line 21, change "cower" to -- power --.

Signed and Sealed this

Twenty-fifth Day of October, 2005

JON W. DUDAS
*Director of the United States Patent and Trademark Office*